(12) United States Patent
Roberts et al.

(10) Patent No.: US 8,855,215 B2
(45) Date of Patent: Oct. 7, 2014

(54) PHASE/FREQUENCY SYNTHESIS USING PERIODIC SIGMA-DELTA MODULATED BIT-STREAM TECHNIQUES

(75) Inventors: Gordon Roberts, Montreal West (CA); Sadok Aouini, Montreal (CA)

(73) Assignee: The Royal Institution for the Advancement of Learning/McGill University, Montreal, Quebec (CA)

( * ) Notice: Subject to any disclaimer, the term of this patent is extended or adjusted under 35 U.S.C. 154(b) by 707 days.

(21) Appl. No.: 13/103,325

(22) Filed: May 9, 2011

(65) Prior Publication Data
US 2012/0288044 A1 Nov. 15, 2012

(51) Int. Cl.
*H04B 14/06* (2006.01)
*H03L 7/00* (2006.01)
*G06F 1/02* (2006.01)

(52) U.S. Cl.
CPC . *G06F 1/022* (2013.01); *H03L 7/00* (2013.01)
USPC .......................................... 375/247; 375/316

(58) Field of Classification Search
CPC ..... H03M 3/00; H04B 14/062; H03C 3/0925; H03C 3/0933; H03C 3/0941; H03C 3/0958; H03L 2207/50; H03L 7/085; H03L 7/099; H03L 7/1803
USPC ............ 375/247, 316; 327/156, 306; 348/538
See application file for complete search history.

(56) References Cited

U.S. PATENT DOCUMENTS

| 2007/0291173 A1* | 12/2007 | Hsin ............................ 348/538 |
| 2008/0204092 A1* | 8/2008 | Moehlmann et al. ......... 327/156 |
| 2011/0267127 A1* | 11/2011 | Staszewski et al. .......... 327/306 |

* cited by examiner

*Primary Examiner* — Daniel Washburn
*Assistant Examiner* — Fitwi Hailegiorgis
(74) *Attorney, Agent, or Firm* — Freedman & Associates

(57) ABSTRACT

A method and a circuit are provided for providing phase or frequency synthesis using sigma-delta modulation bit-stream techniques in which data is encoded utilizing sigma-delta modulation and then digital-to-time conversion (DTC) or digital-to-frequency conversion (DFC). In some embodiments this encoded data stream is further subjected to phase or frequency domain filtering, which in some embodiments is carried out by a higher-order phase-locked loop (PLL).

7 Claims, 43 Drawing Sheets

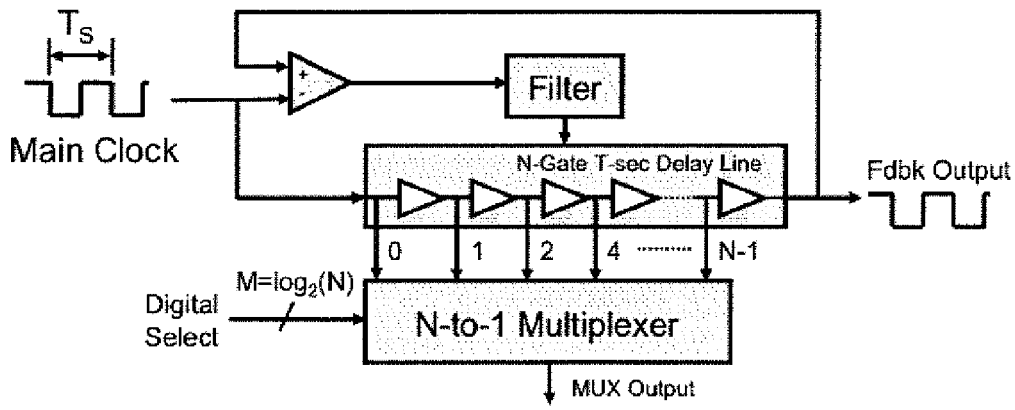
FIG. 7
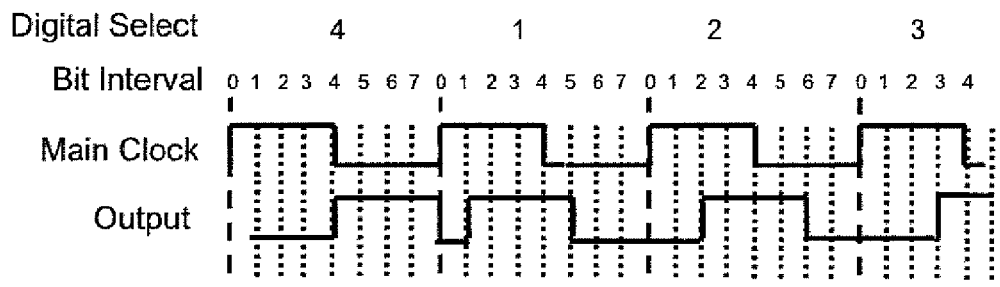
FIG. 8
|  | Input Amplitude Code | Output Phase Code |
|---|---|---|
| D=1 | 0 | 01 |
|  | 1 | 10 |
|  | Input Amplitude Code | Output Phase Code |
|---|---|---|
| D=2 | 00 | 1100 |
|  | 01 | 0110 |
|  | 10 | 0011 |
|  | 11 | 1001 |
FIG. 9

| Input Amplitude Code | Divider Ratios | Output Frequency Code |
|---|---|---|
| 0 | 2 | 1100 |
| 1 | 1 | 1010 |

| Input Amplitude Code | Divider Ratios | Output Frequency Code |
|---|---|---|
| 00 | 24 | 1111 1111 1111 1111 1111 1111 0000 0000 0000 0000 0000 0000 |
| 01 | 12 | 1111 1111 1111 0000 0000 0000 1111 1111 1111 0000 0000 0000 |
| 10 | 8 | 1111 1111 0000 0000 1111 1111 0000 0000 1111 1111 0000 0000 |
| 11 | 6 | 1111 1100 0000 1111 1100 0000 1111 1100 0000 1111 1100 0000 |

US 8,855,215 B2

PHASE/FREQUENCY SYNTHESIS USING PERIODIC SIGMA-DELTA MODULATED BIT-STREAM TECHNIQUES

FIELD OF THE INVENTION

The invention relates generally to data encoding and more particularly to digital to time conversion and digital to frequency conversion.

BACKGROUND

Data conversion is simply the process of working with signals in different number domains. Traditionally, information has been processed and encoded in the voltage domain; however, more recently the encoding of information in time has considerably gained popularity.

It would be advantageous to provide an improved method and system for encoding of data in time and frequency.

SUMMARY OF EMBODIMENTS OF THE INVENTION

In accordance with an embodiment of the invention there is provided a circuit comprising: an input port for receiving data for being encoded; a digital to time converter for encoding the data within a time based aspect of at least a carrier signal to provide an encoded signal; a phase locked loop circuit for filtering the encoded signal to provide a filtered encoded signal; and an output port for providing the filtered encoded signal having the first data encoded therein.

In accordance with another aspect of an embodiment of the invention there is provided a method comprising: receiving digital data for being encoded; encoding at least one bit of the data as a time variation within an encoded signal; and adjusting a phase of the encoded signal to filter noise outside of the band of interest.

In accordance with an embodiment of the invention there is provided a circuit comprising: an input port for receiving data for being encoded; a digital to frequency converter for encoding the data within a signal, the data encoded as signals of different frequencies within the signal to provide an encoded signal; and an output port for providing the encoded signal having the data encoded therein.

In accordance with another aspect of an embodiment of the invention there is provided a method comprising: receiving data for being encoded; encoding the data within a signal, the data encoded as signals of different frequencies within the signal to provide an encoded signal; and providing the encoded signal having the data encoded therein.

BRIEF DESCRIPTION OF THE DRAWINGS

Exemplary embodiments of the invention will now be described in conjunction with the following drawings, in which:

FIG. 7 is a block diagram of a multi-bit digital to time converter hardware implementation comprising of a DLL and a MUX;

FIG. 8 is a simplified data signal diagram representing an output of 3-bit digital to time converter to a 4-1-2-3 input word;

FIG. 9 is a table representing a phase encoding process for 1-bit and 2-bit digital to time converters;

FIG. 14 is a table showing an exemplary digital data to frequency mapping;

DETAILED DESCRIPTION OF EMBODIMENTS OF THE INVENTION

Figure 1:
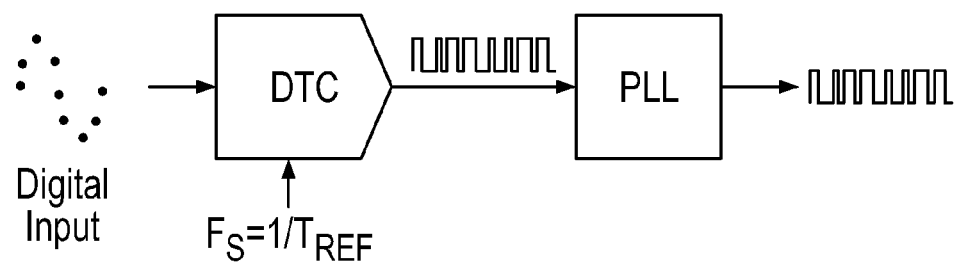
FIG. 1 is a simplified block diagram of a Digital-to-time converter.

Time mode signal processing involves encoding information in the form of time difference variables using for example phase modulation. Referring to FIG. 1, a digital-to-time converter (DTC) is a device used to map a digital value to time, similar to a digital-to-analog converter (DAC) in the voltage amplitude domain. From a system perspective, such a conversion process is often combined with an anti-imaging filter to eliminate images within the output spectrum.

It has been shown that a phase-locked-loop can be used as an anti-imaging filter for DTCs. Just as for any analog filter, one can manipulate its transfer function to optimize the filter response and conversion resolution. More generally, a PLL is a negative feedback system where an oscillator-generates a signal that is phase and frequency locked to a reference signal. PLL's are used for frequency synthesis (e.g. generating a 1.2 GHz clock signal from a 1 GHz reference); skew cancellation (e.g. phase-aligning an internal clock to the I/O clock); and extracting the reference clock from a random data stream such as in serial-link transceivers.

Figure 2:
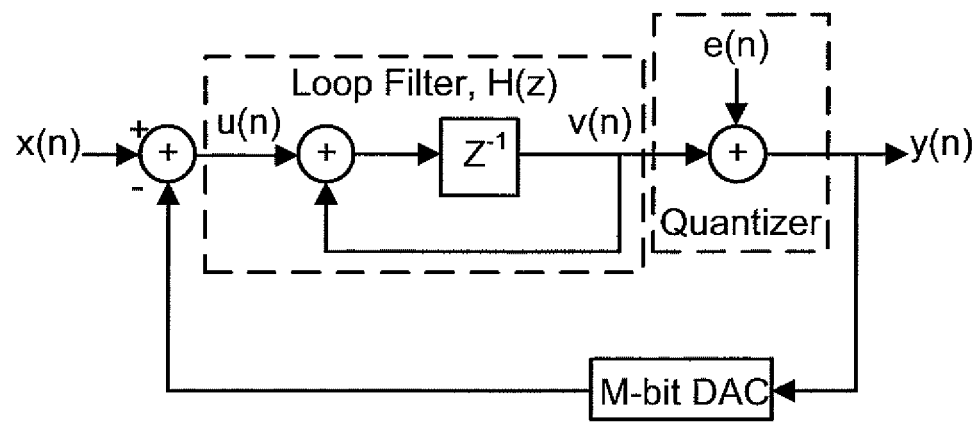
FIG. 2 is a simplified block diagram of a sigma delta modulator architecture.

The basic architecture of a first order sigma-delta modulator is depicted in FIG. 2. As can be observed, the architecture uses feedback to reduce the quantization noise, e(n), of a quantizer. Sigma-delta modulators are oversampling analog-to-digital converters, meaning that the sampling rate of the signal is increased beyond the Nyquist rate. Feedback pushes the noise away from the signal spectrum to the point where a low-resolution quantizer is enough for accurate digitization. The amount of oversampling is defined by the oversampling ratio $$OSR = \frac{f_S}{2f_B}, \qquad (1)$$

where $f_S$ is the sampling frequency and $f_B$ is the signal bandwidth. The digital output signal from the sigma-delta modulator corresponds to a pulse-density modulated version of the input signal.

Referring back to FIG. 2, the time domain difference equation mapping the input signal to the output signal is $$y(n)=x(n-1)+[e(n)-e(n-1)], \qquad (2)$$

where x(n) denotes the input signal, y(n) the output signal and e(n) the quantization noise of the quantizer. The z-transform representation of (2) equals $$Y(z)=z^{-1}X(z)+(1-z^{-1})E(z). \qquad (3)$$

Note that Y(z) is composed of two transfer functions where the first one, $z^{-1}$, corresponds to the signal transfer function (STF) while the second, $(1-z^{-1})$, is the noise transfer function (NTF). The STF has a unity magnitude response while the magnitude response of the NTF starts at zero and increases exponentially to a value of two as it approaches $F_S/2$. This effect of pushing the quantization noise out of the bandwidth of interest is referred to as noise shaping and is a very powerful feature of sigma-delta modulators.

When a signal is quantized or digitized, the resulting signal follows approximately a second-order statistics model with independent additive white noise. Given that the signal is within the range of one step, given by $\Delta$, of the quantized value with an equal distribution, the quantization noise power is found to be $$P_e = \frac{\Delta^2}{12} \tag{4}$$

In general, for an M-bit quantizer the step size $\Delta$ is related to its full scale range ($V_{FSR}$) and the number of bits as follows:

$$\Delta = \frac{V_{FSR}}{2^M - 1} \tag{5}$$

Also the voltage full scale range can be defined as the modulator's quantizer maximum value minus its minimum value, as given by $$V_{FSR} = \Sigma \Delta_{MAX} - \Sigma \Delta_{MIN} \tag{6}$$

Since the power is assumed to be spread evenly between 0 and $f_S/2$, the one-sided power spectral density (PSD) of the quantization error of the ADC in FIG. 2 is equal to $$S_e(f) = \frac{P_e}{f_S} = \frac{\Delta^2}{6 f_S} \tag{7}$$

Figure 3:
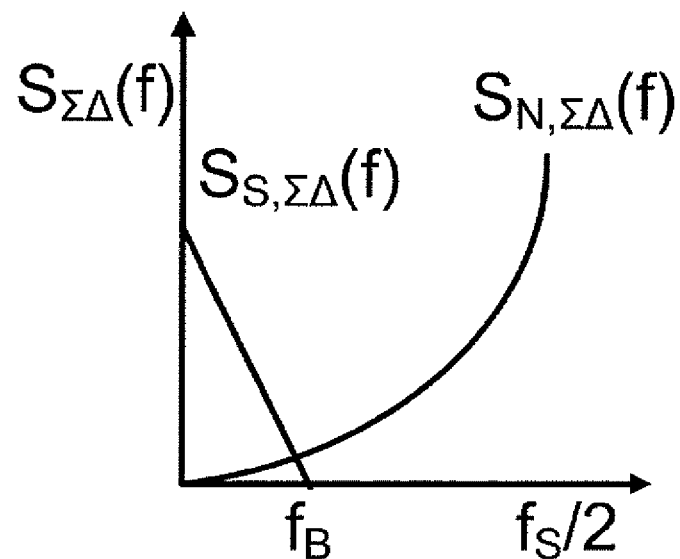
FIG. 3 is a graphical representation of typical signal and noise spectra of a sigma delta modulated signal.

Sigma-delta modulation uses oversampling to further reduce the noise in the band of interest thereby avoiding use of high-precision circuits for the anti-aliasing filter. Note that in general, the quantization noise total power is the same for both Nyquist rate and oversampling converters, but it is distributed over a larger spectrum in the later case. With regards to sigma-delta converters, noise is further reduced at low frequencies, within the band where the signal of interest is, and it is increased at higher frequencies as shown in FIG. 3. In this figure, two spectrums can be observed: $S_{S,\Sigma\Delta}$ which represents the spectrum of the encoded signal and $S_{N,\Sigma\Delta}$ which is the spectrum of the noise-shaped quantization noise. Hence, the spectrum of the total modulator output signal is equal to $$S_{\Sigma\Delta}(f) = S_{S,\Sigma\Delta}(f) + S_{N,\Sigma\Delta}(f) \tag{8}$$

The in-band quantization noise power can be found by integrating the noise power spectral density, $S_{N,\Sigma\Delta}$ between 0 and $f_B$ as shown by the following equation:

$$P_{N,\Sigma\Delta} = \int_0^{f_B} S_{N,\Sigma\Delta}(f) df = \int_0^{f_B} S_e(f) |NTF(f)|^2 df \tag{9}$$

In the case of a first order modulator where the NTF is equal to $(1-z^{-1})$, replacing $z$ by $e^{j2\pi f T}$ and assuming that OSR is much more greater than one then $$P_{N,\Sigma\Delta} = \frac{\Delta^2 \pi^2}{36} \left(\frac{1}{OSR}\right)^3 \tag{10}$$

The signal-to-noise ratio (SNR), is defined as the power of the signal spectrum and the noise spectrum. Thus, the SNR of the sigma-delta modulator output signal is defined as $$SNR_{\Sigma\Delta} = \frac{P_{S,\Sigma\Delta}}{P_{N,\Sigma\Delta}} = \frac{\int_0^{f_B} S_{S,\Sigma\Delta}(f) df}{\int_0^{f_B} S_{N,\Sigma\Delta}(f) df} \tag{11}$$

High order modulators are implementable by utilizing more error history. For example, a second order modulator is implemented by subtracting the previous two samples of the error signal to the current one. Generally, increasing the sigma-delta modulator order would increase the signal-to-noise ratio (SNR); however, more care with regards to the stability of the modulator should be taken. For an $L^{th}$ order modulator having its NTF in the form of $(1-z^{-1})^L$, the in-band noise power for a relatively high OSR is approximated as $$P_{N,\Sigma\Delta} = \int_0^{f_B} S_e(f) |NTF(f)|^2 df \tag{12}$$

$$= \frac{\pi^{2L} P_e}{(2L+1)(OSR)^{2L+1}}$$

When the sampling frequency is increased (or OSR), the quantization noise is lower and the the signal-to-noise ratio (SNR) is higher; however, for higher-order loops, stability considerations typically result in reduced SNR lower than a value than predicted by the above equation.

Typically an analog low-pass filter is used that is at least one order higher than that of the sigma-delta modulator. If the analog filter's order is equal to that of the modulator, the slope of the rising quantization noise matches the one of the filter's attenuation; in that case, the resulting quantization noise has approximately a constant spectral density up to half the sampling rate (fs/2). By ensuring that the analog filter has a higher order than the modulator, the spectral density of the outputted quantization noise will have a bandwidth similar to the one of the filter. Also, the analog filter typically has a high attenuation at high frequencies since most of the quantization noise is around fs/2. In addition, when the modulated signal has a small bandwidth, such as a DC signal or a tone at frequencies smaller than fB (the bandwidth of the modulator), the specification on the filter order can be relaxed as long as its bandwidth is smaller than that of the modulator.

Figure 4:
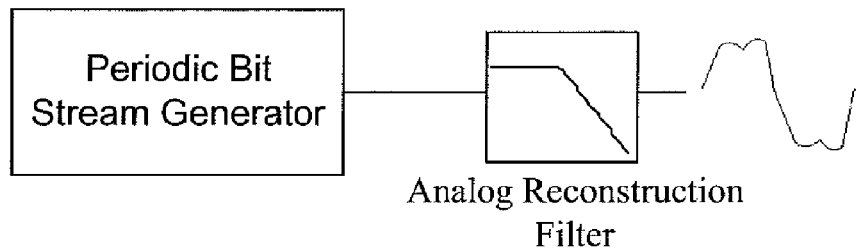
FIG. 4 is a simplified block diagram of a waveform generator.

In order to synthesize an analog test stimulus, a short sequence of digital bits is repeated as to approximate the output signal of a 1-bit sigma-delta modulator when driven by a periodic signal. The process comprises simulating a high-order noise-shaping modulator and collecting a finite number of output samples. A periodic repetition of this sequence approximates the output signal from an infinite-duration sigma-delta oscillator. FIG. 4 shows a block diagram of an on-chip arbitrary waveform generator comprising a memory stream with the encoded modulated bits and an analog filter. In order to obtain a periodic waveform, the output bit sequence is periodic with a period of $N/f_S$, where N is the length of the sequence and FS is the sampling frequency. Thus, the input signal to the sigma-delta modulator is harmonically related to the fundamental frequency of the bit sequence (i.e. Fs/N). Since the approximate sigma-delta modulated output signal is forced to be periodic, it implies that the encoded signal contains only a finite number of frequencies:

$$f_{out} = \frac{M}{N} f_S, M = 0, 1, 2, \ldots, N/2 \qquad (13)$$

This characteristic of the bit-stream generator provides sample coherence with the on-chip waveform digitizer. Coherent sampling requires only a small number of samples for DSP-based testing. Also in the situation of under-sampling digitizers, coherency allows test results to be tracked.

As known from the definition of Fourier Series, all periodic signals can be represented using sinusoids. Therefore, if we can accurately represent all the parameters of a sinusoid, any type of signal can be generated, including amplitude, phase or frequency modulated signals. Using the sigma-delta encoding techniques described above, it has been successfully shown that a DC signal, a sinusoid with different amplitude, a noise signal, which can be seen as the addition of random sinusoids, and a phase modulated signal are generatable.

Figure 5:
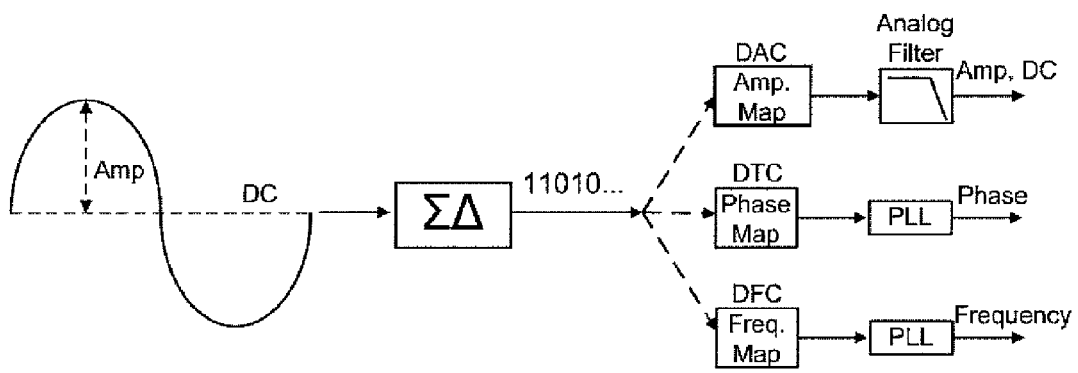
FIG. 5 is a simplified block diagram demonstrating sigma delta encoding in amplitude phase and frequency.

As outlined in FIG. 5, for all types of encoded signals, whether it is in the amplitude, frequency or phase domain, a process is similar: a desired signal is digitally encoded using a sigma-delta modulator and then an appropriate domain mapping is performed. For example, if the signal is to be an amplitude signal, a voltage mode digital-to-analog converter is used, similarly, if the desired signal is to be encoded in phase or frequency a digital-to-time converter (DTC) or a digital-to-frequency (DFC) converter is used, respectively. Just as a filter is required for digital-to-analog conversion to eliminate the presence of images, a phase locked loop (PLL) is used as an analog reconstruction filter for digital-to-time and digital-to-frequency mapping.

Figure 6:
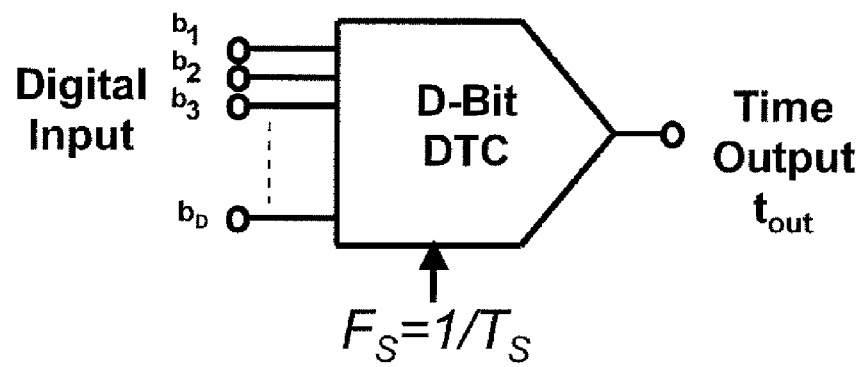
FIG. 6 is a simplified diagram of a D-bit digital-to-time converter.

Referring to FIG. 6, a digital-to-time conversion process is as follows: a multi-bit digital input code is applied to the input port of DTC and a corresponding time signal is generated. The mapping process between input bits and output time signal is $$t_{out}=t_{ref}(b_0+b_1 2^1+b_2 2^2+\ldots+b_{N-1} 2^{D-1})+t_{os}. \qquad (14)$$

A general way of implementing a DTC is through the use of a delay-locked loop (DLL) and a multi-bit multiplexer (MUX). Referring to FIG. 7, the DLL is used to generate different delayed versions of a clock signal and the MUX takes in the digital input word and chooses the corresponding delayed clock. For example, a 3-bit DTC process with a digital input word being the sequence 4-1-2-3 would give the DTC output signal as shown in FIG. 8.

Another way to understand the DTC mapping process is to look at the output sequence in terms of the input sequence. In the case of a 1-bit DTC, every '0' value in the digital domain is mapped to the bit sequence '10' and every '1' is mapped to the sequence '01'. In the case of a 2-bit DTC, every '00' is mapped to the bit sequence '1100', every '01' is mapped to '0110', every '10' is mapped to '0011 and every '11' is mapped to '1001'. A summary of these two cases is listed in FIG. 9. Extension to higher bit levels is straightforward. Of course, other bit mappings are also potentially available though care is preferably taken in accordance with other limitations discussed herein.

Figure 10:
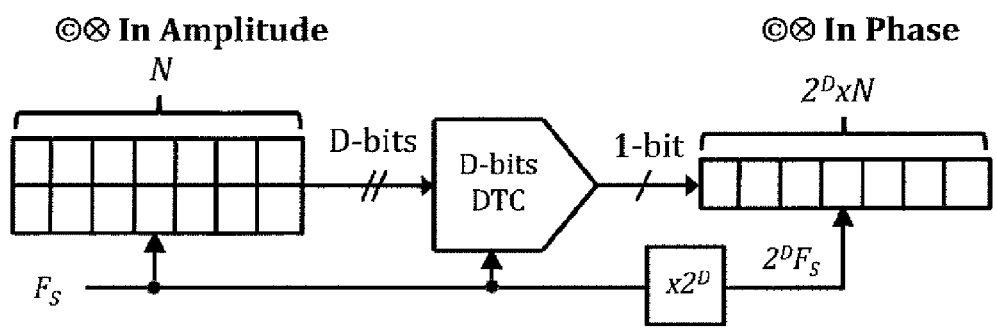
FIG. 10 is a simplified data diagram for a digital to time conversion process using phase encoding of digital data.

An N-bit wide input bit-stream clocked at a rate of FS and encoded by a D-bit DTC will map to a bit-stream of length $2^D \times N$ and is clocked at a rate of $2^D \times F_s$ to establish desired phase characteristics based on the original encoded signal. This process is illustrated in FIG. 10.

Figure 10B:
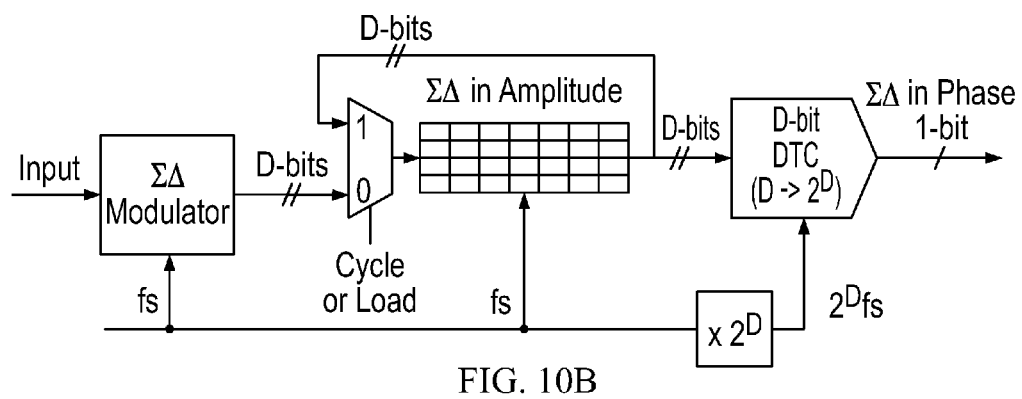
FIG. 10B is a simplified data diagram for a digital to time conversion process using phase encoding of digital data and a circular D-bit memory input and generating a B-bit long serial output.

An alternative embodiment for generating a sigma-delta modulated signal in the phase domain is as shown in FIG. 10B. Here, a D-bit wide parallel circular memory with the sigma-delta encoded signal in the amplitude domain is applied cyclically to a D-bit DTC producing a $2^D$-bit long serial output corresponding to the time-domain encoded phase. Note that the DTC runs $2^D$ times faster than the input cyclic memory.

Figure 11:
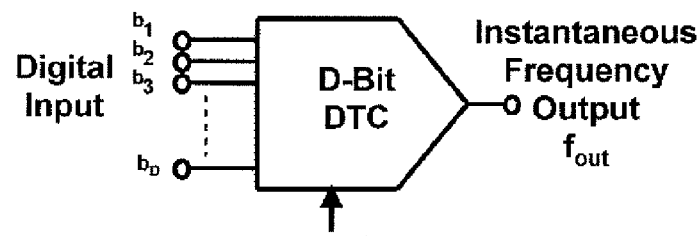
FIG. 11 is a simplified diagram of a digital to frequency converter showing a digital data input port and for providing a frequency encoded signal at an output port thereof.

Just as for the DTC, DFC is used to convert a digital input signal to a corresponding frequency signal as outlined in FIG. 11. Here again, a multi-bit conversion can be used for fine frequency placement. The general DFC equation relating input bits and instantaneous output frequency is $$f_{out}=f_{ref}(b_0+b_1 2^1+b_2 2^2+\ldots+b_{N-1} 2^{D-1})+f_{os} \qquad (15)$$

Figure 12:
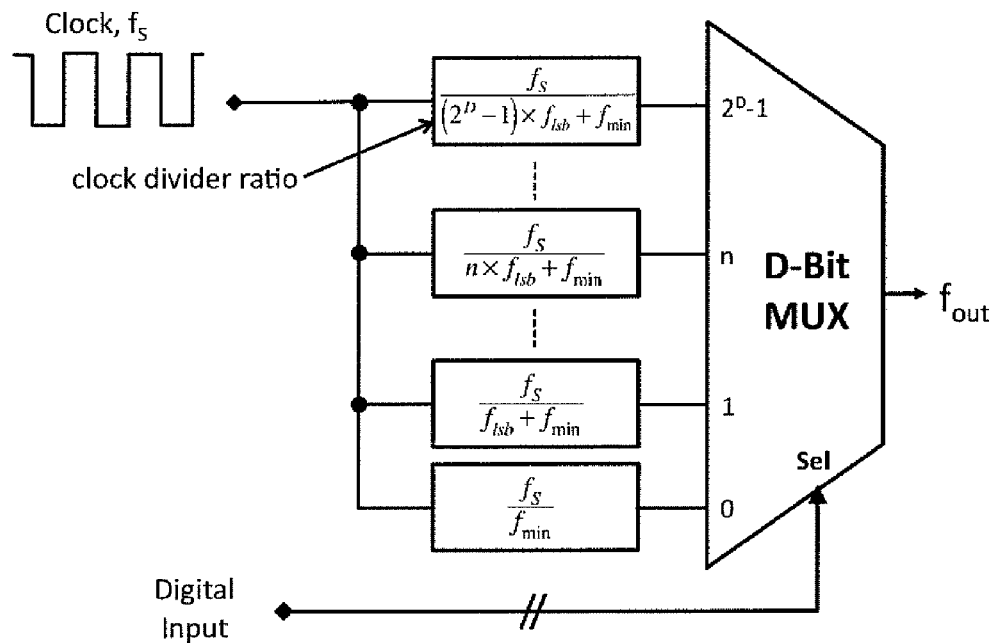
FIG. 12 is a diagram of a multiplexer based implementation of a digital to frequency converter.

A simplified diagram of a hardware implementation of the DFC block is shown in FIG. 12. Here multiple frequencies, all being divided from a master's clock, are coupled to a D-bit MUX and the digital signal is used as a select input signal. Typically, a uniform frequency step size $f_{lsb}$ is ensured. For linear operation, DFC output frequency $f_{out}$ corresponding to the nth select value is given by $$f_{out,n}=n \times f_{lsb}+f_{min}. \qquad (16)$$

where $$f_{lsb} = \frac{f_{max} - f_{min}}{2^D - 1}$$

The clock divider ratio corresponding to a DFC output $f_{out,n}$ is equal to $$\frac{F_S}{f_{out,n}} = \frac{F_S}{n \times f_{lsb} + f_{min}} \qquad (17)$$

For this embodiment, some practical concerns are also addressed. In order to implement the DFC using simple clock dividers, such as counters, all divider ratios are selected as integers. This is true if the master clock FS is a multiple of a least common multiple of all the factors of each frequency term, i.e., $$F_S=\text{LCM}\{0 \times f_{lsb}+f_{min}, 1 \times f_{lsb}+f_{min}, K, (2^D-1) \times f_{lsb}+f_{min}\} \qquad (18)$$

where LCM stands for the least common multiple. For example, to construct a 2-bit DFC using the following four frequencies: 25 MHz, 50 MHz, 75 MHz and 100 MHz, we need to write each frequency term in terms of its prime factors:

25=1×5×5

50=2×5×5

75=3×5×5

100=2×2×5×5

The least common multiple is then 300 (1×5×5×3×2×2)

The master clock then has a rate FS equal to 300 MHz (or a multiple thereof) and each divider value is given by taking the clock rate FS and dividing it by the desired clock rate. For example for 25 the divider is 300/25, which is 12, when 300 MHz is used as the master clock rate.

In order to ensure that the phase is continuous across each frequency change, each frequency signal completes a phase change that is a multiple of $2\pi$. As all frequencies are linear multiples of one another, this condition is satisfied when each frequency is transmitted for a time-duration equal to the period of the lowest frequency. Correspondingly, this means that each frequency completes $f_{out,n}/f_{out,min}$ cycles in this time interval. For the running example above each frequency will be transmitted for $\frac{1}{25}$ MHz or 40 ns resulting in the 100 MHz signal completing 4 cycles, the 75 MHz completing 3 cycles and the 50 MHz signal completing 2 cycles and, of course, the 25 MHz signal completing 1 cycle. In terms of the number of cycles an output frequency signal completes with respect to the sampling frequency $F_S$ is simply given by $F_S/f_{out,n}$. For the four signal frequencies associated with the DFC, we would have 300/100=3, 300/75=4, 300/50=6 and 300/25=12; identical to the divider ratio found previously.

Figure 13:
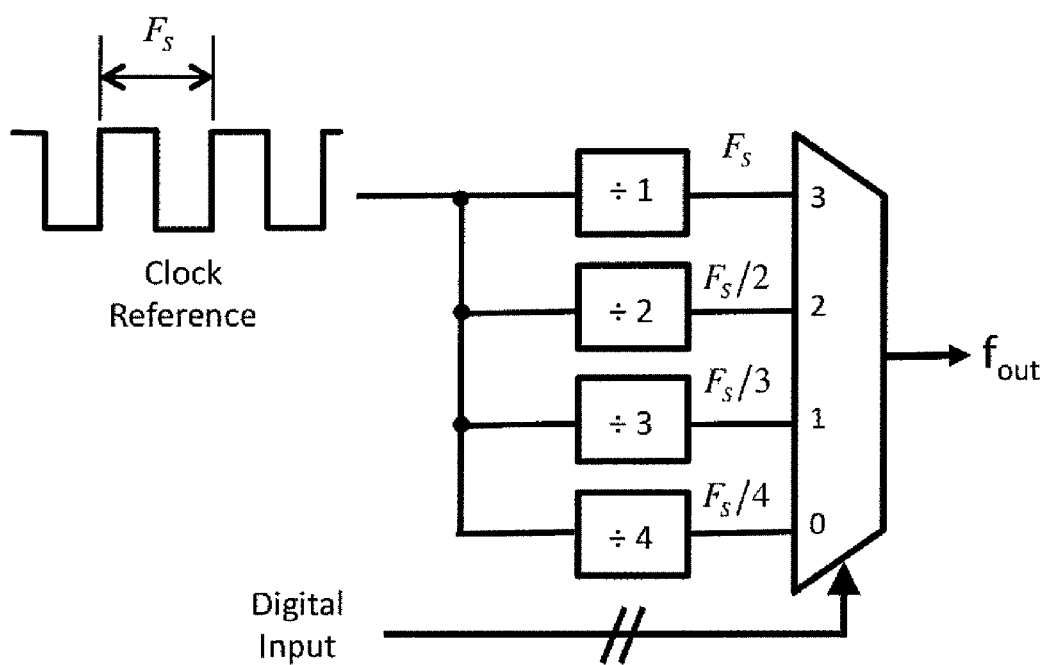
FIG. 13 is a diagram of a multiplexer based implementation of a digital to frequency converter relying on integer clock dividers.

In addition, a simpler hardware implementation is to simply divide the frequencies in an ascending fashion as shown in FIG. 13. However, in this case, the frequencies are not distributed in a linear manner. A solution is to account for the non-linear frequency steps in software by properly compensating the sigma-delta modulator DAC in software.

Once again, recognizing that the operation of the DFC is to take as input signal an N-length periodic bit-stream consisting of D-bit wide words and create as output signal a 1-bit periodic bit-stream whereby each input word is mapped to a corresponding sequence of bits representing a particular frequency component. For example, for a 1-bit DFC consisting of two frequencies, $f_1$ and $f_2$ where $f_2=2\times f_1$, the operation of the DFC is to convert a logical '0' input bit to a 1100 output sequence, and a logical '1' input bit to a 1010 output sequence, at a clock rate 4 times the original bit stream clock rate. The mapping process is summarized in FIG. 14.

The above embodiment is illustrated with the block diagram shown in FIG. 15(a). Here the appropriate clock frequencies are shown relative to the DFC sampling frequency $F_S$. The output bit-stream is 4 times larger in length than the input bit-stream, and operates at 4 times the clock speed of the input bit-stream.

The bit mapping approach is general can be applied to a D-bit DFC. This is captured in the block diagram shown in FIG. 15(b). The input bit-stream comprising D-bit wide words is clocked at the lowest frequency associated with the DFC, i.e. $F_S/N_{min}$, where $N_{min}$ is the divider ratio associated with $f_{min}$. Correspondingly, the output bit stream is increased in bit length by the factor $2\times N_{min}$. Also, the output bit stream is clocked at twice the clock frequency of the DFC or, alternatively, relative to the clock rate of the input bit stream by a factor of $2\times N_{min}$.

Take the 2-bit DFC implementation described earlier involving the four output frequencies, 25, 50, 75 and 100 MHz. The minimum divider used had a value of 12 ($N_{min}$) which suggests an N-bit sequence consisting of 2-bit words will map to a 1-bit sequence having a total length of 24N bits. The output bit-stream is clocked at a rate 24 times greater than the input bit-stream. In terms of the mapping sequence, FIG. 16 lists the 4 possible input bit mappings for a 48N implementation. As is evident from the listing, the number of repeating 1's or 0's in each sequence is equal to the divider ratio found earlier.

Alternatively, when using a multiplexer to multiplex signals of different frequencies, the lowest frequency signal is a DC signal representing a bit stream of all '1's or of all '0's. This allows for one of the multiplexed signals to be encoded having half the frequency of the lowest frequency otherwise described hereinabove. Thus data is encoded as constant or alternating at different frequencies depending on the value. This in turn results in a lower operating bandwidth of the overall system in at least some implementations.

Figure 15:
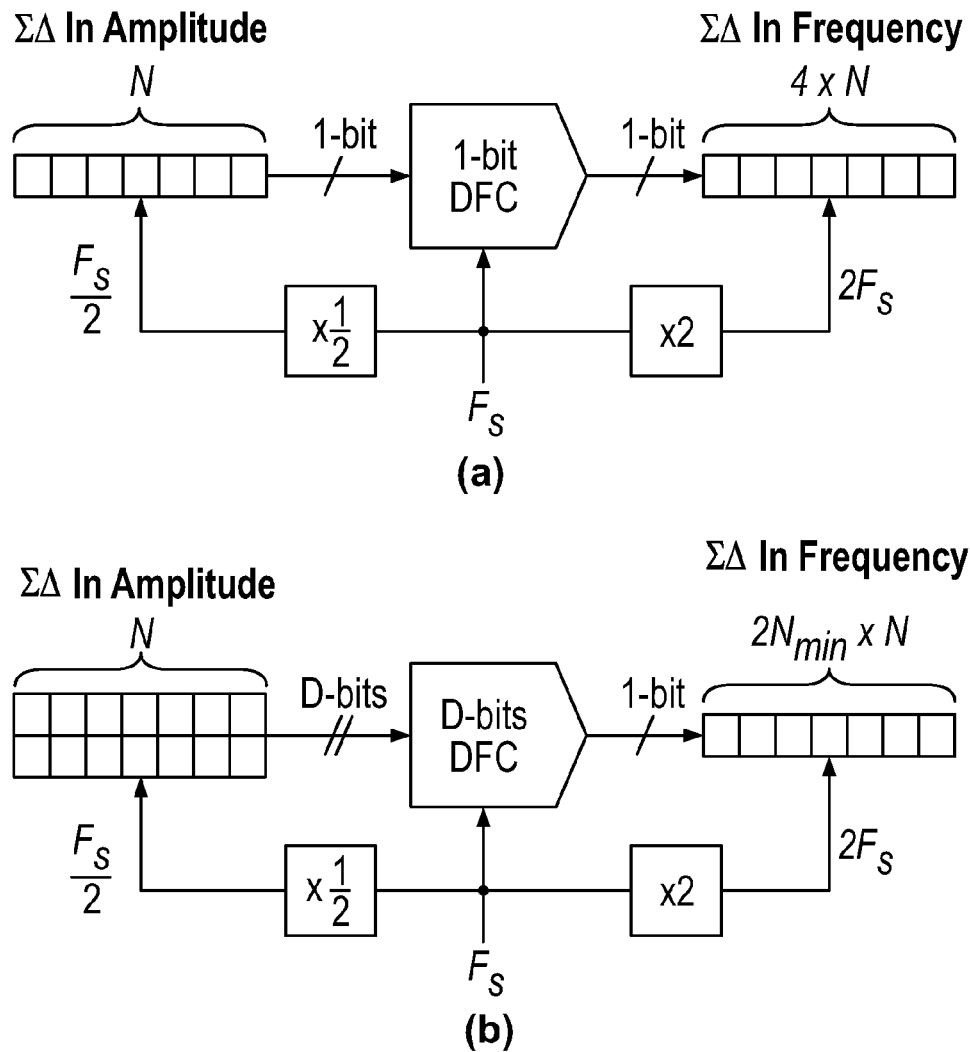
FIG. 15 is a data diagram showing data conversion during frequency encoding for the one bit implementation and for a D bit implementation.
Figure 15B:
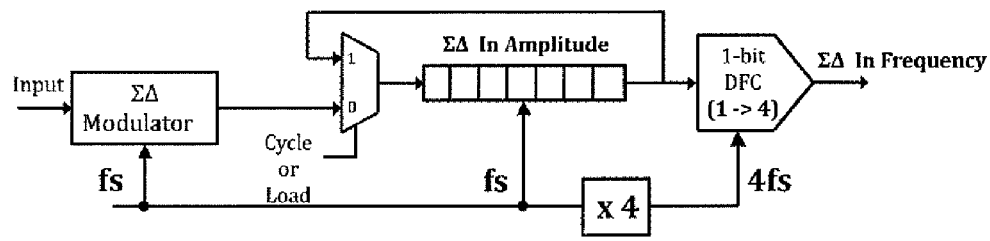
FIG. 15B is a simplified data diagram for a digital to frequency conversion process using a 1-bit DFC and a periodic sigma-delta encoded DC value.
Figure 15C:
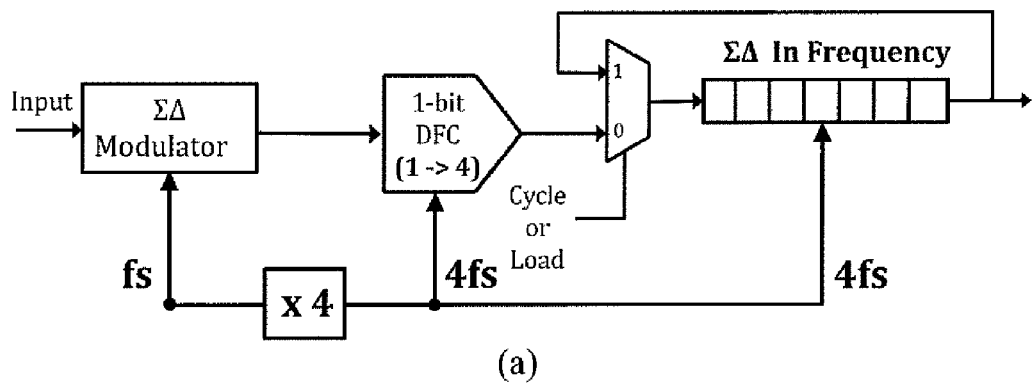
FIG. 15C is a data diagram showing data conversion during frequency encoding using cyclic memory for the one bit implementation and for a D bit implementation.
Figure 15C:
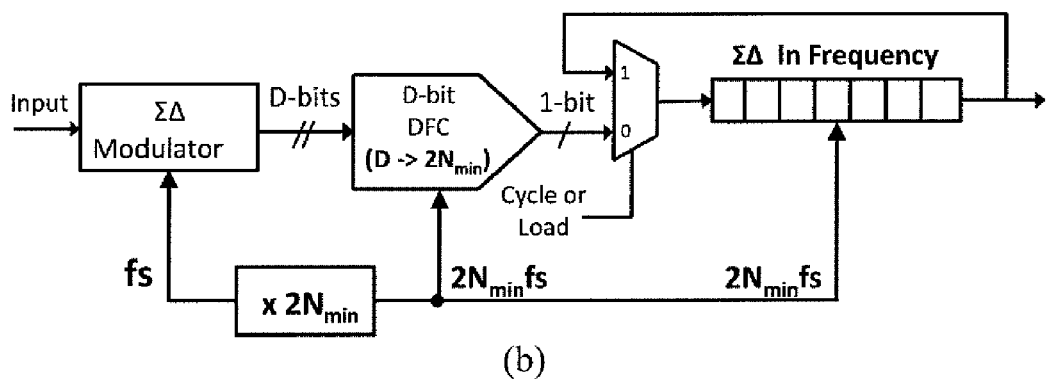

In an alternative embodiment for a 1-bit DFC process, as depicted in FIG. 15B, a DC value is first encoded in a cyclic memory using a sigma-delta modulator; then, the DC encoded bit-stream is mapped to the frequency domain through a DFC that runs 4 times faster than the input bit rate. Here, the DFC takes in a 1-bit input and produces a 4-bit long serial output. Another avenue is to generate directly a cyclic bit-stream with the encoded frequency by having the sigma-delta modulator drive directly the DFC and capturing the output bit sequence in a circular memory, as illustrated in FIG. 15C(a). The frequency encoding process is general and can be applied to a D-bit DFC. This is captured in the block diagram shown in FIG. 15C(b). Note that the input to the DFC consists of D-bit parallel codes and $2N_{min}$-bit long serial output codes are generated, where $N_{min}$ is the divider ratio associated with $f_{min}$. Here, the output bits containing the encoded frequency can either be outputted continuously or cycled through. Note that the sigma-delta modulator as well as the DFC can either be implemented physically in hardware or in software without loss of generality.

With regards to phase, every sigma-delta modulated bit is mapped to a corresponding discrete phase through a DTC. An interesting analogy here is to see the amplitude domain sigma-delta modulator followed by the DTC as an equivalent sigma-delta modulation process occurring in phase. Hence, the parameters of the sigma-delta modulator are mapped in a one-to-one correspondence to those of a sigma-delta modulator operating in the phase domain. Indeed, the modulator order, bandwidth and SNR should be equivalent in both domains. So here a maximum value of the sigma-delta modulated signal in the amplitude domain, $\Sigma\Delta_{MAX}$, is mapped to a maximum phase shift $\phi_{MAX}$; likewise, a minimum value of the sigma-delta modulated signal in the amplitude domain, $\Sigma\Delta_{MIN}$, is mapped to a minimum phase shift $\phi_{MIN}$, without loss of generality if it is encoded using a single or multi-bit conversion. The amplitude to phase mapping coefficient is defined as $$\alpha_\phi = \frac{\phi_{MAX} - \phi_{MIN}}{\Sigma\Delta_{MAX} - \Sigma\Delta_{MIN}} \left[\frac{\text{rads}}{\text{V}}\right] \tag{19}$$

This equation defining $\alpha$, can also be seen as taking the full-scale range of the DTC over the full-scale range of the sigma-delta converter. In addition, an offset term $\phi_{os}$ is optionally present to link the output instantaneous phase $\phi_{out}$ and the DTC input signal $DTC_{in}$ as given by $$\phi_{out} = \alpha_\phi DTC_{in} + \phi_{os} \tag{20}$$

Equations (20) and (14) are related. In fact, in (14) $t_{ref}$ is converted to the phase domain by multiplying it by $\omega_S$ ($\omega_S = 2\pi/T_S$, where $T_S$ is sampling period of the DTC as shown. Likewise $t_{os}$ of (14) is converted to $\phi_{os}$ by a similar relationship.

Since the DTC relates an input amplitude to a corresponding output phase signal by multiplying it by $\alpha_\phi$, the spectrum of a DTC output signal is optionally written in terms of the sigma-delta output PSD as $$S_{DTC}(f) = \begin{cases} \left(\alpha_\phi \sqrt{S_{\Sigma\Delta}(f)} + \phi_{OS}\right)^2, & f = 0 \\ \alpha_\phi^2 S_{\Sigma\Delta}(f), & f \neq 0 \end{cases} \tag{21}$$

According to equation (8), the PSD of the sigma-delta output signal is then optionally decomposed into a signal and noise component such that PSD of the DTC output signal is (for f≈0)

$$S_{DTC}(f) = \alpha_\phi^2 S_{S,\Sigma\Delta}(f) + \alpha_\phi^2 S_{N,\Sigma\Delta}(f) \qquad (22)$$

Figures 16, 17:
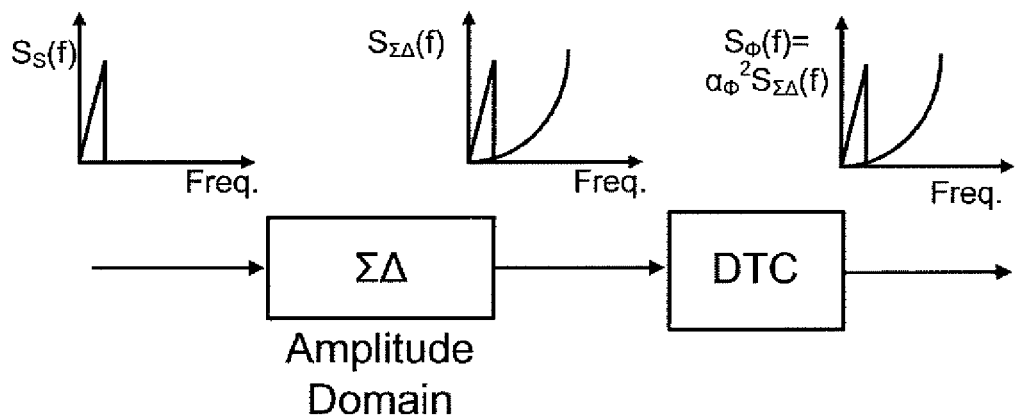
FIG. 16 is a table showing an amplitude to frequency mapping for a 2 bit digital to frequency converter, for example having 4 output frequencies, f1, 2f1, 3f1, and 4f1.
FIG. 17 shows a simplified mapping from the amplitude domain to the phase domain.

FIG. 17 illustrates the PSD of the sigma-delta modulator and the DTC. Assuming the phase signal lies within the bandwidth of the reconstruction filter, and hence experiences near-zero attenuation, the signal power is $$P_{S,\phi} = \alpha_\phi^2 \int_0^{f_B} S_{S,\Sigma\Delta}(f) df \qquad (23)$$

In much the same way as for the sigma-delta modulated bits, a carefully designed phase-filtering function, implemented, for example, by the PLL, is used to properly filter out the out-of-band quantization noise. With that ensured, the noise power after filtering is $$P_{N,\phi} = \alpha_\phi^2 \int_0^{f_B} S_{N,\Sigma\Delta}(f) df = \alpha_\phi^2 \frac{\pi^{2L} P_e}{(2L+1)(OSR)^{2L+1}} \qquad (24)$$

The SNR of the overall process is found, using the terms above, to be $$SNR_\phi = \frac{P_{S,\phi}}{P_{N,\phi}} = \frac{\alpha_\phi^2 \int_0^{f_B} S_{S,\Sigma\Delta}(f) df}{\alpha_\phi^2 \int_0^{f_B} S_{N,\Sigma\Delta}(f) df} = SNR_{\Sigma\Delta}. \qquad (25)$$

where $SNR_{\Sigma\Delta}$ is given by equation (11).

Similar to the above analysis for phase synthesis, frequency synthesis is also supported. With regards to the DFC process, the sigma-delta bits are mapped to instantaneous frequencies. Here, the maximum value of the sigma-delta modulated signal in the amplitude domain, $\Sigma\Delta_{MAX}$, is mapped to the maximum frequency $f_{MAX}$; likewise, the minimum value of the sigma-delta modulated signal in the amplitude domain, $\Sigma\Delta_{MIN}$, is mapped to the minimum frequency $f_{MIN}$, without loss of generality whether it is encoded using a single or multi-bit conversion. Here again, a mapping coefficient between the amplitude and frequency domain is $$\alpha_f = \frac{f_{MAX} - f_{MIN}}{\Sigma\Delta_{MAX} - \Sigma\Delta_{MIN}} \left[\frac{Hz}{V}\right] \qquad (26)$$

$\alpha_f$ is a full-scale range of the DFC divided by a full-scale range of the sigma-delta modulator. In addition, an offset term $f_{os}$ is optionally present when linking the output frequency $f_{out}$ and the DFC input $DFC_{in}$ as given by $$f_{out} = \alpha_f \times DFC_{in} + f_{os} \qquad (27)$$

Equations (27) and (15) are related. In fact, in (15), $f_{ref}$ is optionally expressed as $\alpha_f$. Likewise $f_{os}$ in both equations are same.

The spectrum of the DFC output signal is written in terms of the sigma-delta output PSD as $$S_{DFC}(f) = \begin{cases} \left(\alpha_f \sqrt{S_{\Sigma\Delta}(f)} + f_{OS}\right)^2, & f = 0 \\ \alpha_f^2 S_{\Sigma\Delta}(f), & f \neq 0 \end{cases} \qquad (28)$$

which is then written in a more detailed form (for f≈0) as $$S_{DFC}(f) = \alpha_f^2 S_{S,\Sigma\Delta}(f) + \alpha_f^2 S_{N,\Sigma\Delta}(f) \qquad (29)$$

Assuming the quantization noise carried over from the sigma-delta encoding process is removed by a filtering function realized by the PLL, the noise power at the output port of the PLL is $$P_{N,f} = \alpha_f^2 \frac{\pi^{2L} P_e}{(2L+1)(OSR)^{2L+1}} \qquad (30)$$

To ensure that the in-band noise level is same as that given by the above equation, the frequency-filtering function of the PLL at least matches the bandwidth and has a higher order than the sigma-delta modulator. Consequently, the PLL frequency transfer function is designed accordingly and should have at least one order higher when compared to the modulator. However, just as for the amplitude domain, if the signal encoded using sigma-delta modulation has a smaller bandwidth than the modulator, the order of the filtering function of the PLL can be relaxed by also lowering its bandwidth.

The SNR of the DFC process has the same SNR established by the sigma-delta encoding process.

Figure 18:
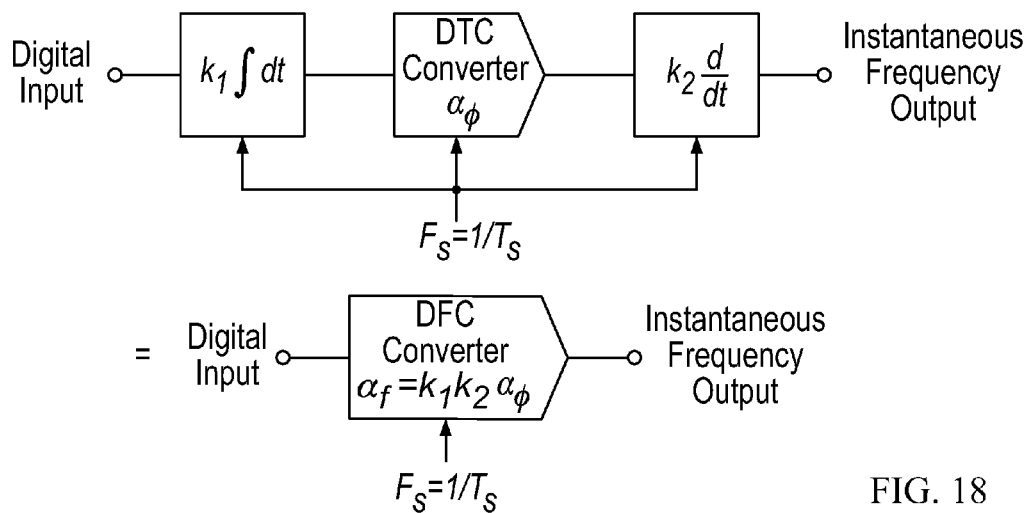
FIG. 18 is a diagram showing equivalence of implementations in order to support simplifying the overall system design.

A derivative of instantaneous phase gives instantaneous frequency. Hence, some time varying phase signals (e.g. a ramp) result in a non-zero frequency. As depicted in FIG. 18, integrating a digital input signal prior to applying it to the DTC (to make it time varying) and differentiating the DTC output signal is equivalent to applying the digital input signal straight to a DFC.

Figure 19:
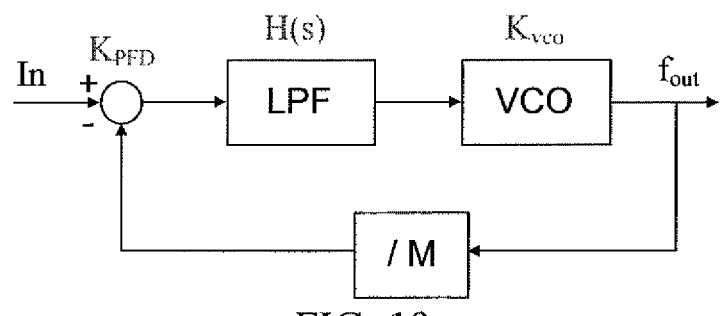
FIG. 19 is a simplified block diagram of a phase locked loop (PLL)

As outlined in FIG. 19, a PLL comprises a phase/frequency detector (PFD), a loop filter and a voltage controlled oscillator (VCO) in a feed-forward path and an optional frequency divider in a feedback path. Under steady state conditions, the phase/frequency detector creates an output signal whose average is linearly proportional to the phase or frequency difference of its two input signals with a gain $K_{PFD}$. The loop filter is a lowpass filter having transfer function H(s). Its function is to reject the unwanted high frequency components produced by the PFD and filter out the DC component representing the appropriate frequency.

Higher order PLL's can be designed to behave as a high order time domain filter (for both phase modulated and frequency modulated signals). A high order filter is desirable as it provides a frequency response close to an ideal time domain low-pass filter; thus, performing high attenuation of out-of-band quantization noise. Given that the loop filter (LPF) transfer function can be expressed as H(s)=N(s)/D(s), the PLL transfer function for the case where the loop divider (M) is equal to one is given by:

$$G(s) = \frac{K_{PFD} N(s) K_{VCO}}{sD(s) + K_{PFD} N(s) K_{VCO}} \qquad (31)$$

The PLL transfer function is manipulated in order to achieve a desigated frequency response by carefully choosing the loop filter coefficient of N(s) and D(s). A signal encoded in phase or frequency, is filtered after passing it through the PLL.

Figure 20:
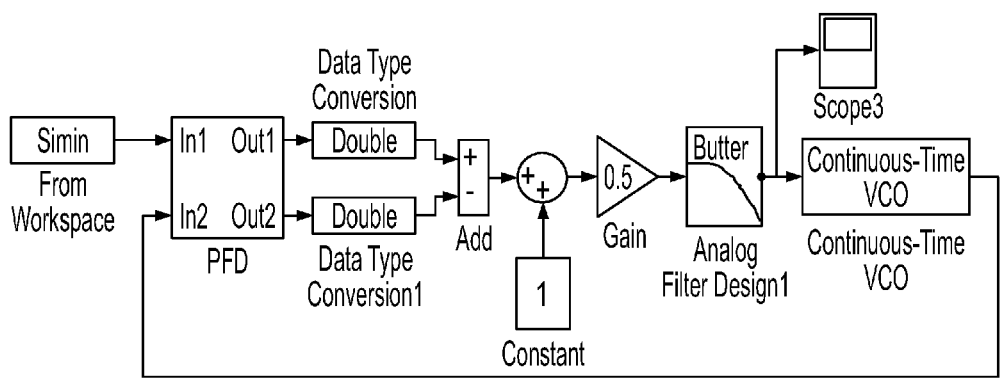
FIG. 20 is a diagram of a Matlab® implementation of the PLL of FIG. 19.

The proposed frequency encoding scheme was implemented in Matlab/Simulink® A DC value was first encoded using sigma-delta modulation. The resulting bit-stream was then mapped to a fixed encoded frequency using the procedure described above. Following that, the new bit sequence was applied to the input port of a PLL model, shown in FIG. 20, and the output frequency was observed.

Figure 21:
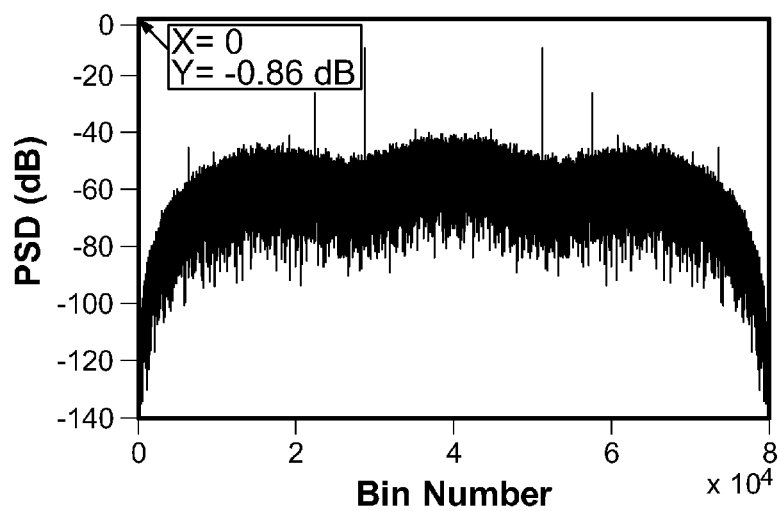
FIG. 21 is a graph of an FFT of DC encoded value using a $\Sigma\Delta$ modulator having an OSR of 120 and an SNR of 84 dB in the pass-band region.

The sigma-delta modulator used to encode a DC value ranging from 0 V to 1 V has a second order noise transfer function, an oversampling ratio of 120 and a Signal-to-Noise-Ratio of 84 dB in the pass-band region. For example, a DC value of 0.64 V was encoded and the FFT of the resulting bit-stream is as depicted in FIG. 21. As it can be observed, there is a tone at Bin 0 (i.e. DC) and quantization noise is pushed up to high frequencies. Further, the plot is symmetric about N/2.

Figure 22:
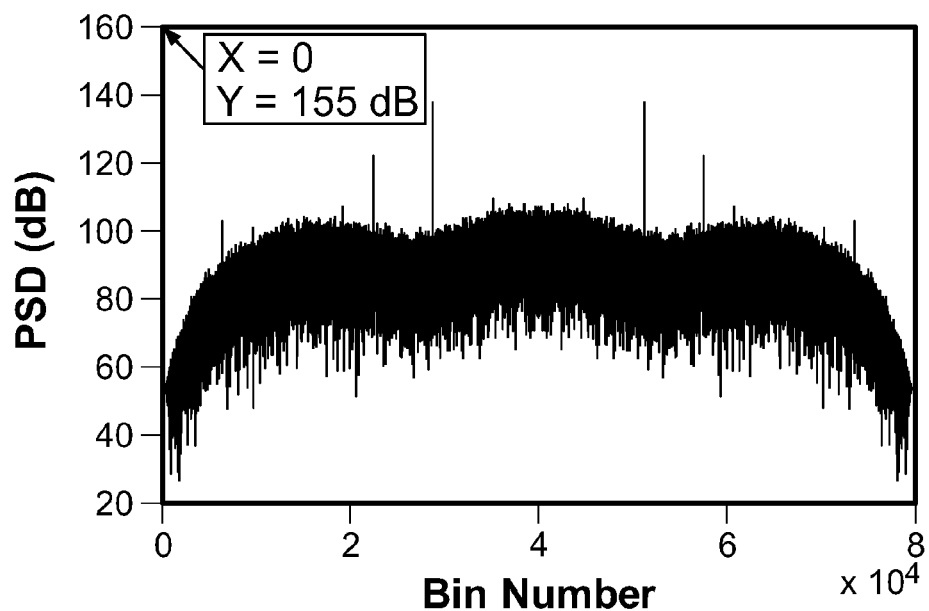
FIG. 22 is a graph of an FFT of DFC output spectrum with respect to the instantaneous frequency.

To convert a bit-stream representing the DC value, a Matlab script that maps every '1' value to '1010' and every '0' value to '1100' is used. Here, it is assumed that the '1010' frequency corresponds to 50 MHz and '1100' to 25 MHz; hence, the sampling rate FS equals 50 MHz (rate at which the DFC block in FIG. 15 operates). FIG. 22 shows the DFC output power spectral density with respect to the instantaneous frequency. The DFC spectrum is related to the sigma-delta spectrum as given by equation (28). Since the encoded DC value is 0.64 V, the encoded frequency '$f_{out}$' can be found by equation (27) and is equal to $$f_{out} = \alpha_f \times DFC_{in} + f_{os} = \frac{(f_{MAX} - f_{MIN})}{(1-0)} \times DC + f_{MIN} \quad (32)$$

In this case, '$f_{out}$' corresponds to 41 MHz.

Alternatively, the lowest frequency signal is a DC signal representing a bit stream of all '1's or of all '0's. This allows for one of the multiplexed signals to be encoded having half the frequency of the lowest frequency otherwise described hereinabove. Thus data is encoded as constant or alternating at different frequencies depending on the value. This in turn results in a lower operating bandwidth of the overall system in at least some implementations.

Figure 23:
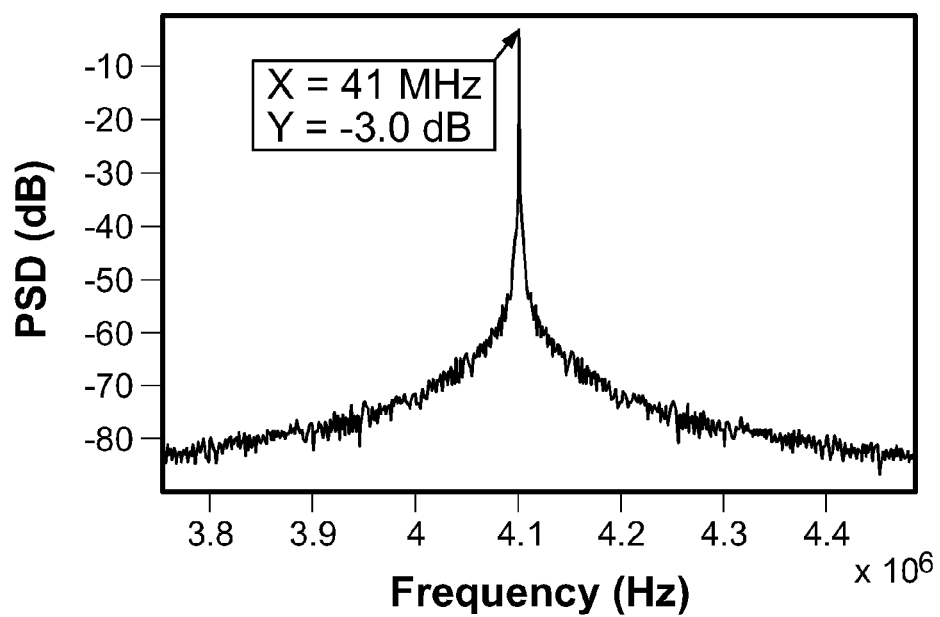
FIG. 23 is a graph of an FFT of the PLL output signal showing the tone at 41 MHz.

The PLL model used for simulation was defined to have similar characteristics as the prototype. Hence, the phase/frequency detector is defined to have a gain $K_{PFD}$ equal to 0.34 V/rad, the VCO has a gain $K_{VCO}$ equal to 76.6 Mrad/V/s. Also, the low-pass filter connected at the output port of the phase/frequency detector is first order and has 1 kHz 3-dB frequency. For this example, the effective transfer function of the PLL is $2^{nd}$ order with a bandwidth of 100 kHz. When the bit stream containing the encoded frequency is applied to the input port of the PLL, the resulting frequency generated by the VCO is indeed equal to 41 MHz, as seen in FIG. 23. Also, a PLL having a $6^{th}$ order transfer function with 93 dB attenuation at 1 MHz has also been used and as expected, the phase noise of the generated frequency signal is considerably lower.

Figure 24:
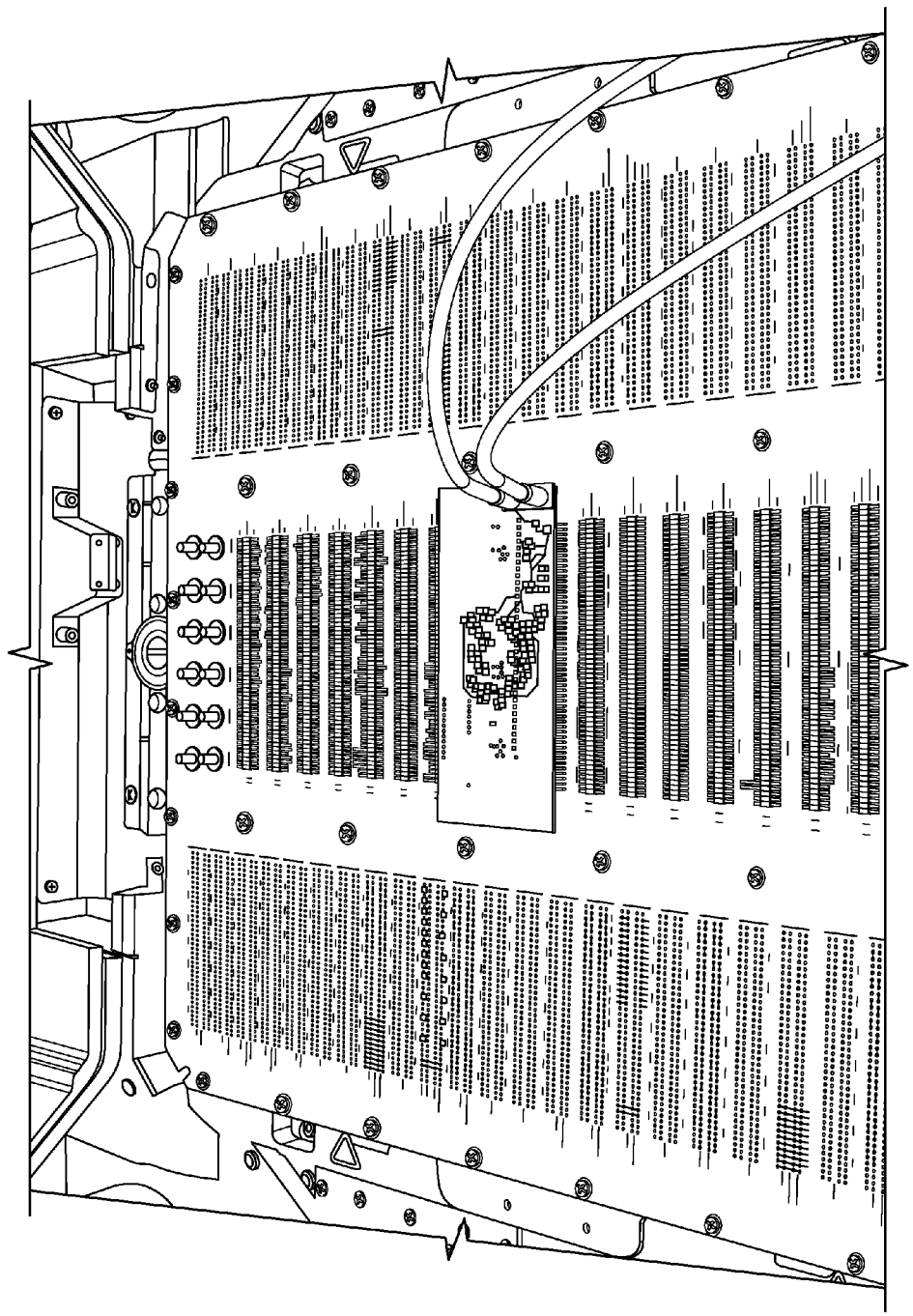
FIG. 24 is an image a test setup for testing an embodiment of the invention.
Figure 25:
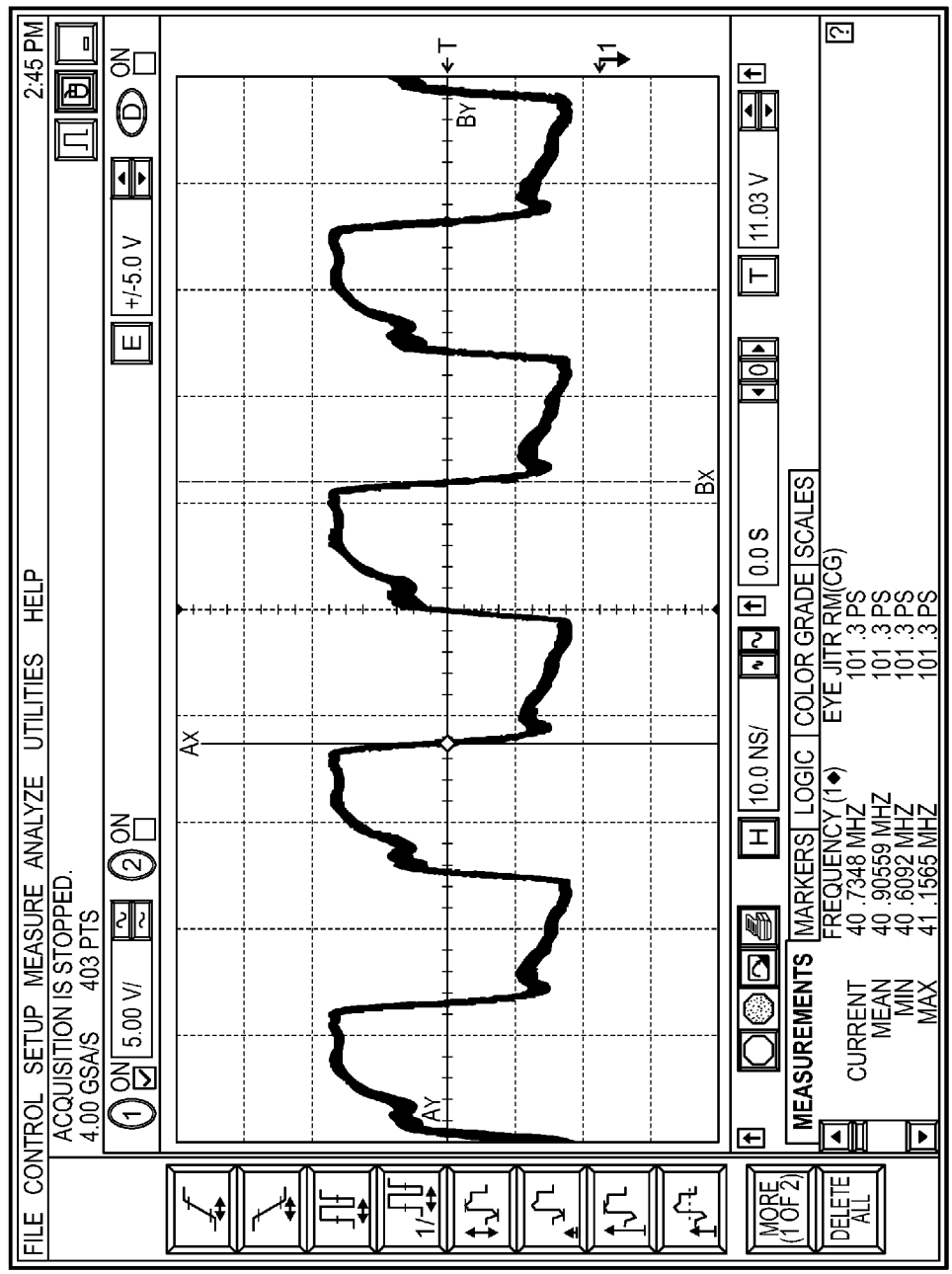
FIGS. 25 and 26 are screen captures of an oscilliscope testing the test setup of FIG. 24 in operation.
Figure 26:
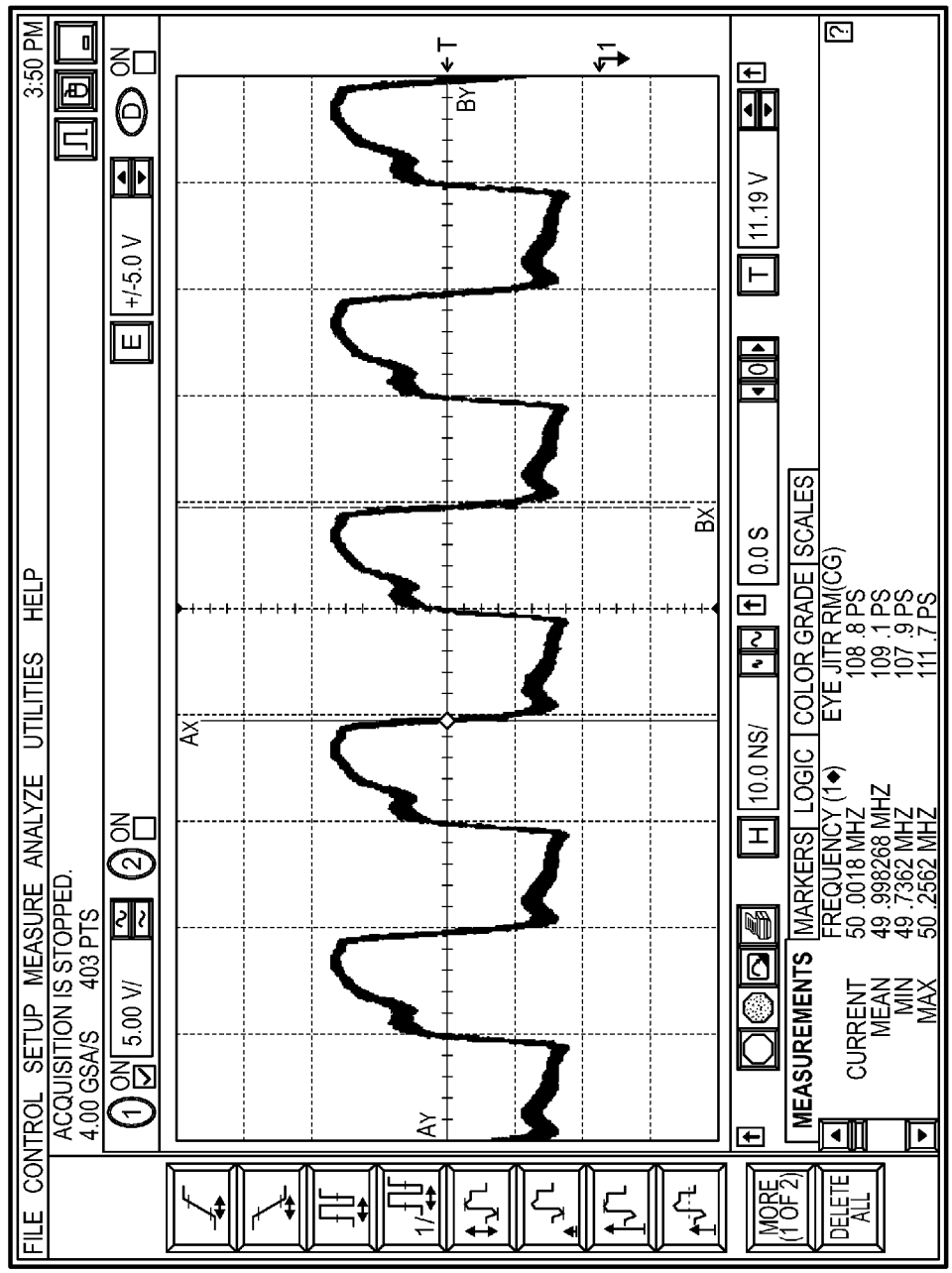
Figure 27:
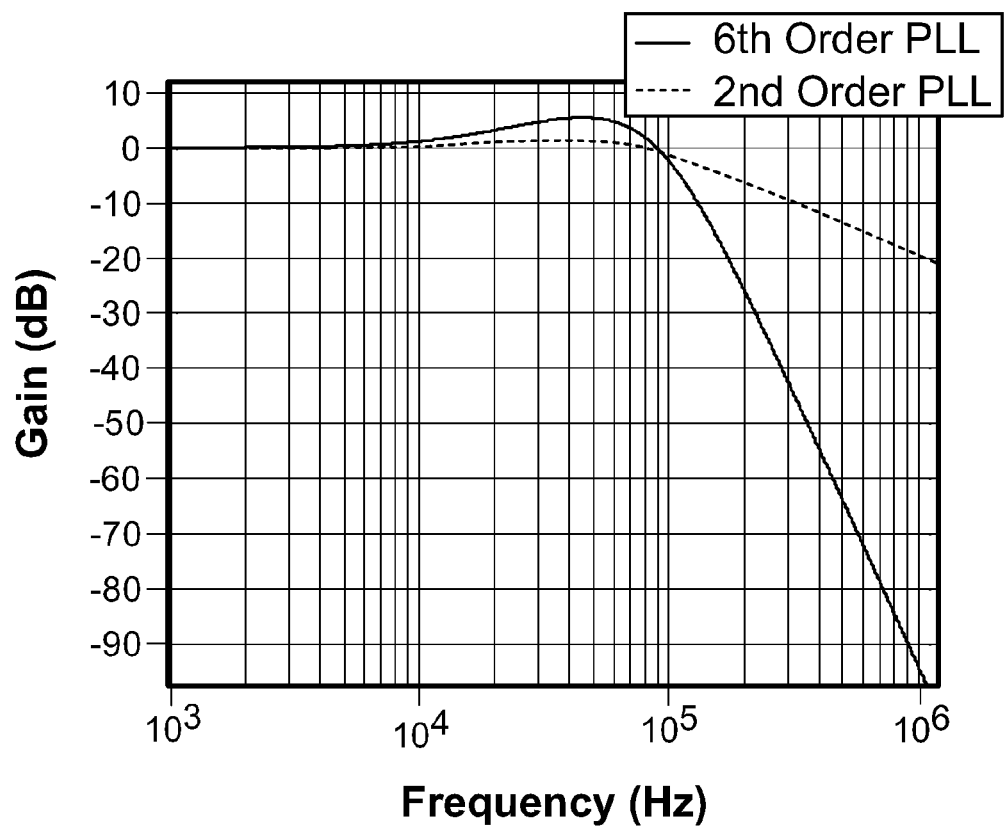
FIG. 27 is a graph of 2nd and 6th order a PLL simulated frequency response.

Referring to FIG. 24, a PCB board having the PLL specifications described was built and tested. The bits were first generated in Matlab® using a second order sigma-delta modulator having an OSR of 120. For the test setup, a stream of 300,000 bits was captured and stored in the cyclic source memory of the High Speed Digital (HSD) instrument of a Teradyne Flex tester. These bits were then outputted in a cyclic fashion at 100 MHz rate through the HSD unit and then applied to the input port of the PLL board. The frequency filtering is then performed by the PLL and the encoded frequency is recovered at the output port. FIG. 25, shows a time domain screen capture of the synthesized frequency. In order to get a sense of the noise present in the setup itself, a 50 MHz clock was outputted from the tester and applied to the PLL board, similar to the encoded frequency, an RMS jitter of about 100 ps is also present as observed on FIG. 26. Also, a PLL board having a $6^{th}$ order transfer function and a 100 kHz 3-dB bandwidth was also used for these tests. Here again, the synthesized frequency matched the one we encoded and an RMS jitter of only 70 ps was present. Hence, as expected, the $6^{th}$ order PLL does filter out more of the quantization noise than a typical $2^{nd}$ order filter such as that described above. A more detailed description of the PLL board having a $6^{th}$ order transfer function follows hereinbelow in association with FIGS. 27-44.

Figure 28:
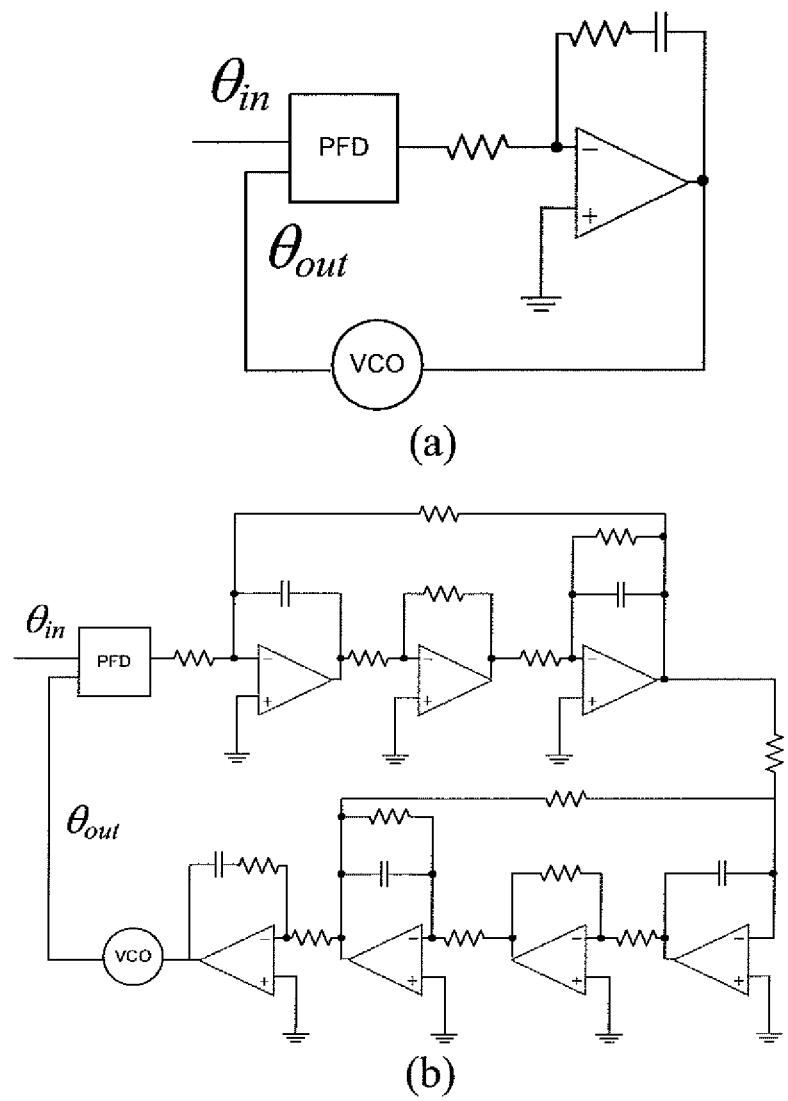
FIG. 28 depicts a second-order PLL circuit and a sixth order to PLL circuit.

The following describes, in association with FIGS. 27-44, the further simulation and testing of two PLL embodiments: a $2^{nd}$ and $6^{th}$ order. Both implementations were designed to be type-II unity-feedback PLLs and have a 100 kHz half-power bandwidth. The poles and zeros for the $2^{nd}$ and $6^{th}$ order designs are listed in Table 1 and Table 2, respectively, and their frequency response curve is plotted in FIG. 27. One can note a gain peaking near the cutoff region of the PLL. This peaking may not be desired in some applications, such as those requiring the cascading of such PLLs since it could amplify the phase noise in that frequency band. However, it is acceptable for the application described herein, as there is no cascading of PLLs and the quantization noise in the gain peaking region is deemed to be small since it is still within the bandwidth of the sigma-delta modulator. The circuit realization for each PLL is shown in FIG. 28. For the second order PLL, an active filter generates the DC pole and stabilizing zero of a type-II PLL. With regards to the $6^{th}$ order PLL, H(s) is built with two second-order Tow-Thomas biquads, together with a first order active stage which, here again, generates the DC pole and the stabilizing zero.

TABLE 1

Pole and zero for designed $2^{nd}$ order PLL.

| Zero | Open loop pole | Closed loop pole |
|---|---|---|
| $-1.9429 \times 10^5$ | $0 \pm j0$ | $(-3.3167 \pm j1.3738) \times 10^5$ |

TABLE 2

Poles and zeros for designed $6^{th}$ order PLL.

| Zero | Open loop poles | Closed loop poles |
|---|---|---|
| $-1.0327 \times 10^6$ | $0 \pm j0$ | $(-3.6851 \pm j4.5720) \times 10^5$ |
| | $(-1.0104 \pm j0.4600) \times 10^6$ | $(-4.4115 \pm j2.5145) \times 10^5$ |
| | $(-0.2701 \pm j0.7803) \times 10^6$ | $(-4.7096 \pm j0.8111) \times 10^5$ |

The proposed phase/frequency encoding scheme has been simulated using Matlab/Simulink®. A DC value is first encoded using sigma-delta modulation. The resulting bit-stream is then mapped to a fixed encoded phase or frequency using the procedure described hereinabove. Following that, the new bit sequence is applied to the input of a PLL and the output phase or frequency is observed.

First, DC encoding is described and the effect of the bit-stream length on its quality is investigated, then phase synthesis is investigated and the results for a $6^{th}$ order PLL case are reported. For emphasis on the frequency synthesis process, simulation results for both a $2^{nd}$ and $6^{th}$ order PLL implementation are reported. However, the same analysis could be performed for phase generation as well. The PLL models used for simulation were defined to have similar characteristics as the one of the experimental setup. The phase/frequency detector is defined to have a gain $K_{PFD}$ equal to 0.34 V/rad, the VCO has a gain $K_{VCO}$ equal to 76.6 Mrad/V/s, for a full voltage swing of 5 V. At the output of the phase/frequency detector is an active filter with a pole at DC (as described in above) giving either an effective $2^{nd}$ or $6^{th}$ order low-pass transfer function for the PLL with a closed-loop bandwidth of 100 kHz.

The length of the bit-stream used to encode the sigma-delta modulated signal directly affects its quality. The main interest here is in a DC sigma-delta encoded signal which is then mapped to either phase or frequency. It can be shown that the DC resolution of a periodic bit-stream is inversely proportional to its length. However, one should also consider the impact of the AC components originating from the repetition of the bit-stream on the DC level. Indeed, these AC components give rise to fast transitions in the encoded bit-stream and the low-pass filter should filter them out to insignificant levels. The superposition of the filtered AC components can all be combined together and, generally, can be tolerated if it is less than half of the desired DC resolution. Consequently, the smallest number of bits required to achieve a given DC resolution with a negligible AC ripple should be at least twice the number of levels (e.g. for a 10-bit DC resolution, N should be at least $2\times2^{10}$) as given by:

$$N \geq 2 \times 2^{bit\text{-}resolution} \tag{33}$$

Figure 29:
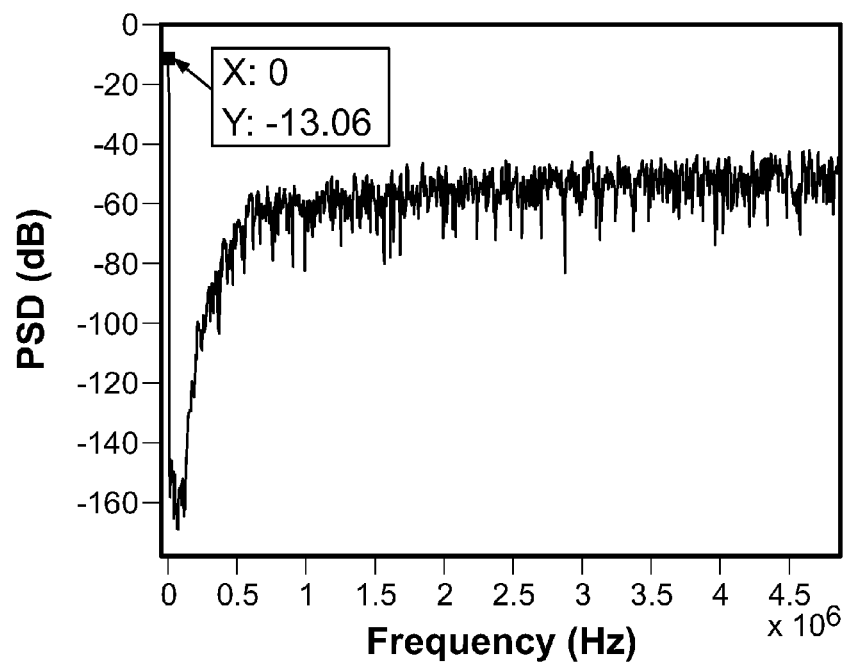
FIG. 29 is a graph of an FFT of a 0.5 DC encoded value using a sigma delta modulator having an OSR of 64 and an SNR of 94.95 dB in the pass-band region.
Figure 30:
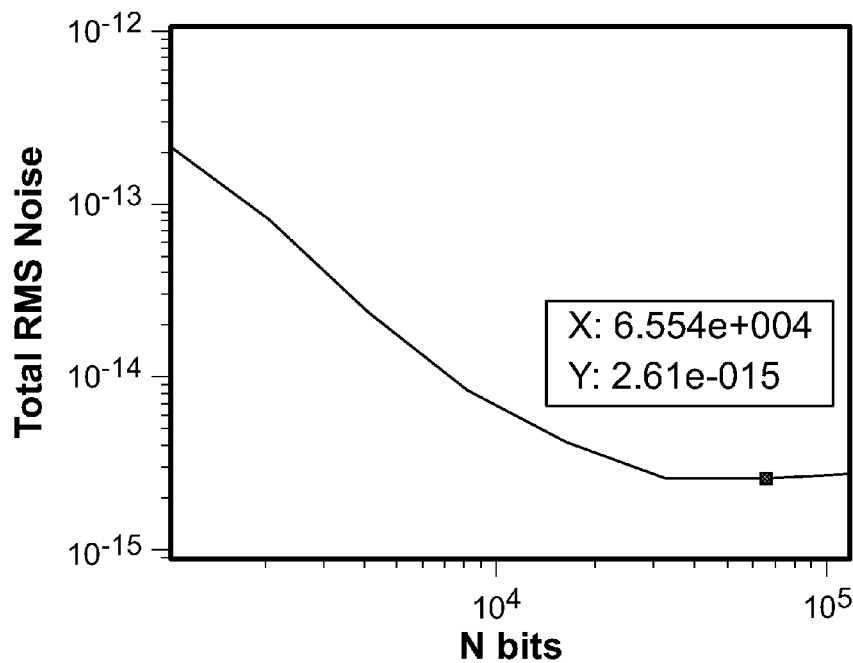
FIG. 30 is a graph of total in-band RMS noise versus bitstream length N.

This is a conservative measure to make sure the bit length is not affecting the modulator performance. For example, for a sigma-delta encoded DC value of 0.5, the spectrum is as shown in FIG. 29, note that a Blackman-Harris window was applied prior to taking the FFT to avoid leakage. One can note a tone at DC and the quantization noise pushed up to high frequencies. This modulator gives an average in-band SNR of 94.95 dB, or about 15 bits of resolution. Equation (33) suggests that a bit length of 65536 ($2^{16}$) will suffice to achieve the desired resolution. To confirm this, the total in-band noise is plotted against the bit stream length N in FIG. 30. As can be seen, the noise decreases with an increase of N up to about 65536, after which the noise level remains relatively constant as N is further increased.

The bits used for phase synthesis have been encoded here using a sigma-delta modulator having a $5^{th}$ order noise transfer function. The modulator has the following specifications: a $\Sigma\Delta_{MIN}$ and $\Sigma\Delta_{MAX}$ of 0 and 1 respectively, an oversampling ratio of 64 and an SNR of 95 dB in the pass-band region.

Figure 31:
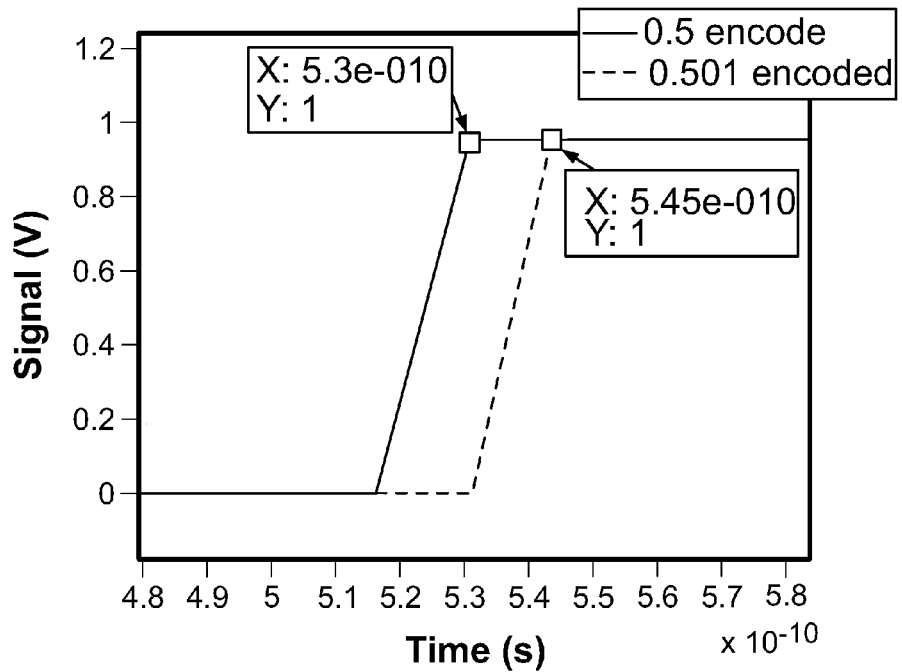
FIG. 31 is a graph of two sample outputs where DC values of 0.5 and 0.501 are encoded.

In the experimental PLL board, the PFD is defined to be positive edge triggered. In order to ensure that the simulation setup has the same parameters as the experimental setup, it was ensured that the phase-modulated codes applied to the PFD exhibited a well-defined rising edge. For example, the code pair '1100' and '0011' would not work, as '1100' will not be captured by the PFD when following '0011', since a rising edge is not present. Consequently, to convert the bit-stream representing the DC value to a corresponding phase shift, a Matlab script that maps every '0' value to '1100' and every '1' value to '0110' is used (note that this is not the same mapping as the original one shown in FIG. 9 to accommodate for the operation of the specific PFD). It is assumed here that the '1100' pattern corresponds to zero phase shift and '0110' to $\pi/2$. The bit-stream is clocked at 15 ns per point to the PLL. Thus, the effective period per sigma-delta bit is 60 ns giving a sampling frequency of 16.67 MHz. This will also be the carrier frequency that the PLL will lock on to. FIG. 31 shows two sample outputs, where DC values of 0.5 and 0.501 are encoded. Based on the equation described in (20), the time difference between the two sets of code will be 15 ps, which is consistent with the simulation result.

To investigate the impact of the PLL order on frequency synthesis, simulations for two implementations were carried out: the first one where both the sigma-delta modulator and the PLL have an order of 2 and the second one where a $5^{th}$ order modulator is used together with a $6^{th}$ order PLL. For both cases, the sigma-delta modulator used to encode a DC value has a range from a $\Sigma\Delta_{MIN}$ of 0 to a $\Sigma\Delta_{MAX}$ of 1, an oversampling ratio of 120 and a SNR of 84 dB in the pass-band region for the $2^{nd}$ order modulator and of 131 dB for the $5^{th}$ order one.

To convert the bit-stream representing the DC value, a Matlab script that maps every '1' value to '1010' and every '0' value to '1100' is used. Here, it is assumed that the '1010' frequency pattern corresponds to 50 MHz and '1100' to 25 MHz; hence, every frequency word is sampled at 25 MHz and this corresponds to the effective sampling rate of the frequency encoding process. Note that since both the $2^{nd}$ and $6^{th}$ order PLLs have a bandwidth of 100 kHz, the maximum allowable OSR that the frequency encoding process can handle is actually 125 (25 MHz divided by twice the bandwidth of the PLL). However, since we are only encoding a DC value, we chose to use a smaller OSR for our modulators in order to increase the amount of quantization noise filtered out. For example, if a DC value of 0.62 is encoded using a sigma-delta modulator having a $\Sigma\Delta_{MIN}$ of 0 and a $\Sigma\Delta_{MAX}$ of 1 and a DFC having an $f_{MIN}$ of 25 MHz and an $f_{MAX}$ of 50 MHz, the synthesized frequency $f_{out}$ can be found using equation (27) and is equal to $$\frac{(f_{MAX} - f_{MIN})}{(1-0)} \times DC + f_{MIN} = 40.5 \text{ MHz} \tag{34}$$

Figure 32:
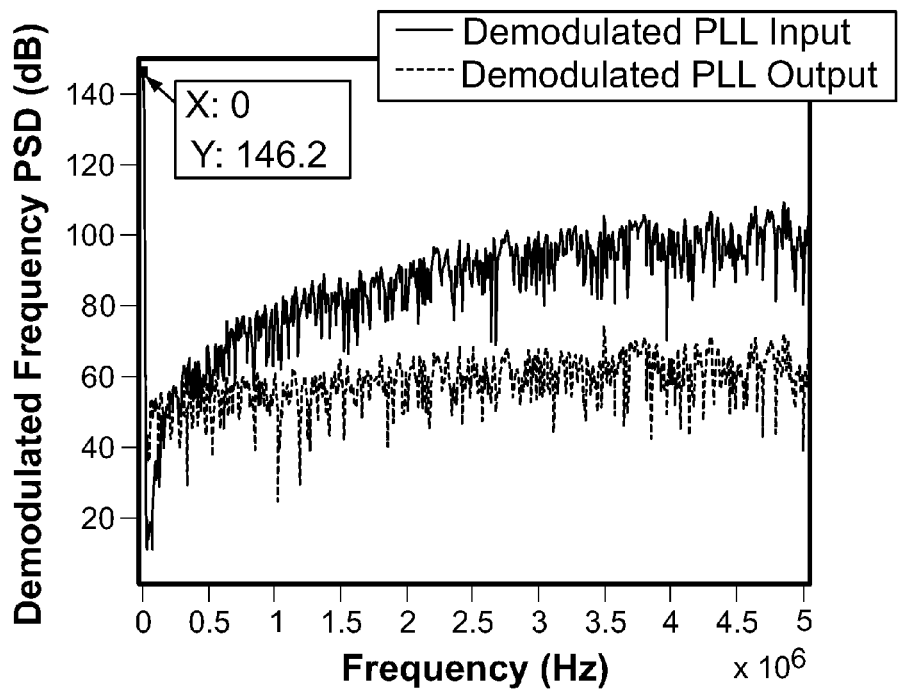
FIG. 32 is a graph of PSD of the demodulated second-order PLL input and output.
Figure 33:
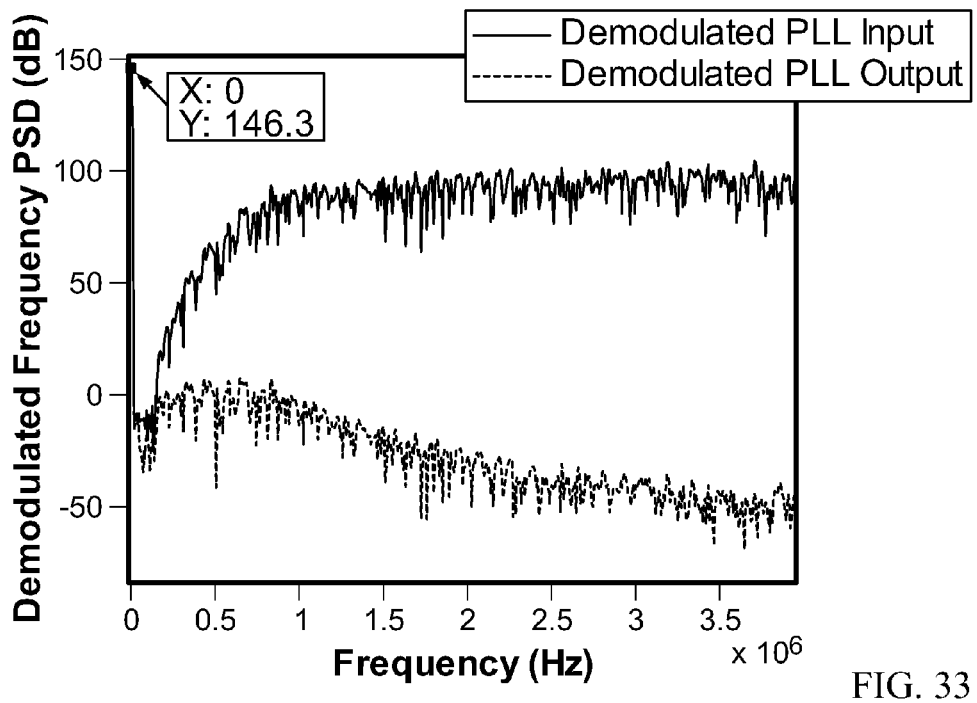
FIG. 33 is a graph of PSD of the demodulated sixth order to PLL input and output.
Figure 34:
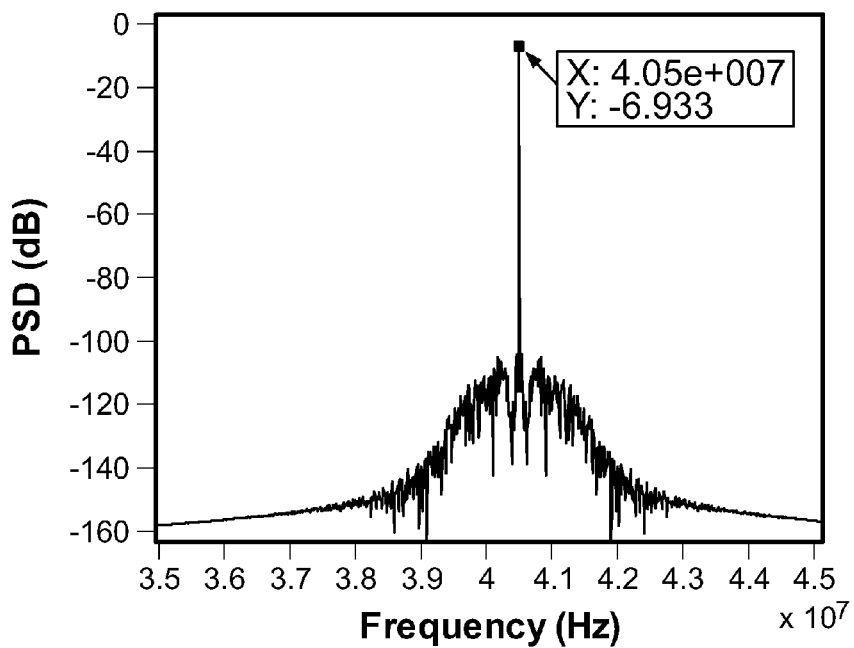
FIG. 34 is a graph of an FFT of the PLL output signal.

FIG. 32 and FIG. 33, show the frequency demodulated PLL input and output for the $2^{nd}$ and $6^{th}$ order PLL, respectively (note that a 0 dB would correspond to an instantaneous frequency amplitude of 1 rad/sec). As can be observed, for both cases the PLL behaves as a frequency domain filter that suppresses the out of band quantization noise. One can also note that the noise floor of the demodulated PLL output signal is considerably lower for the $6^{th}$ order PLL by about 100 dB when compared to the $2^{nd}$ order one. Also, when the bit-stream containing the encoded frequency is applied to the input of the PLL, the resulting frequency generated by the VCO is indeed equal to 40.5 MHz, as can be observed in FIG. 34 for the $6^{th}$ order PLL example. Here one can clearly observe the main tone together with the noise shaping action before the PLL's filtering action kicks in at about 100 kHz away from the main tone.

Figure 35:
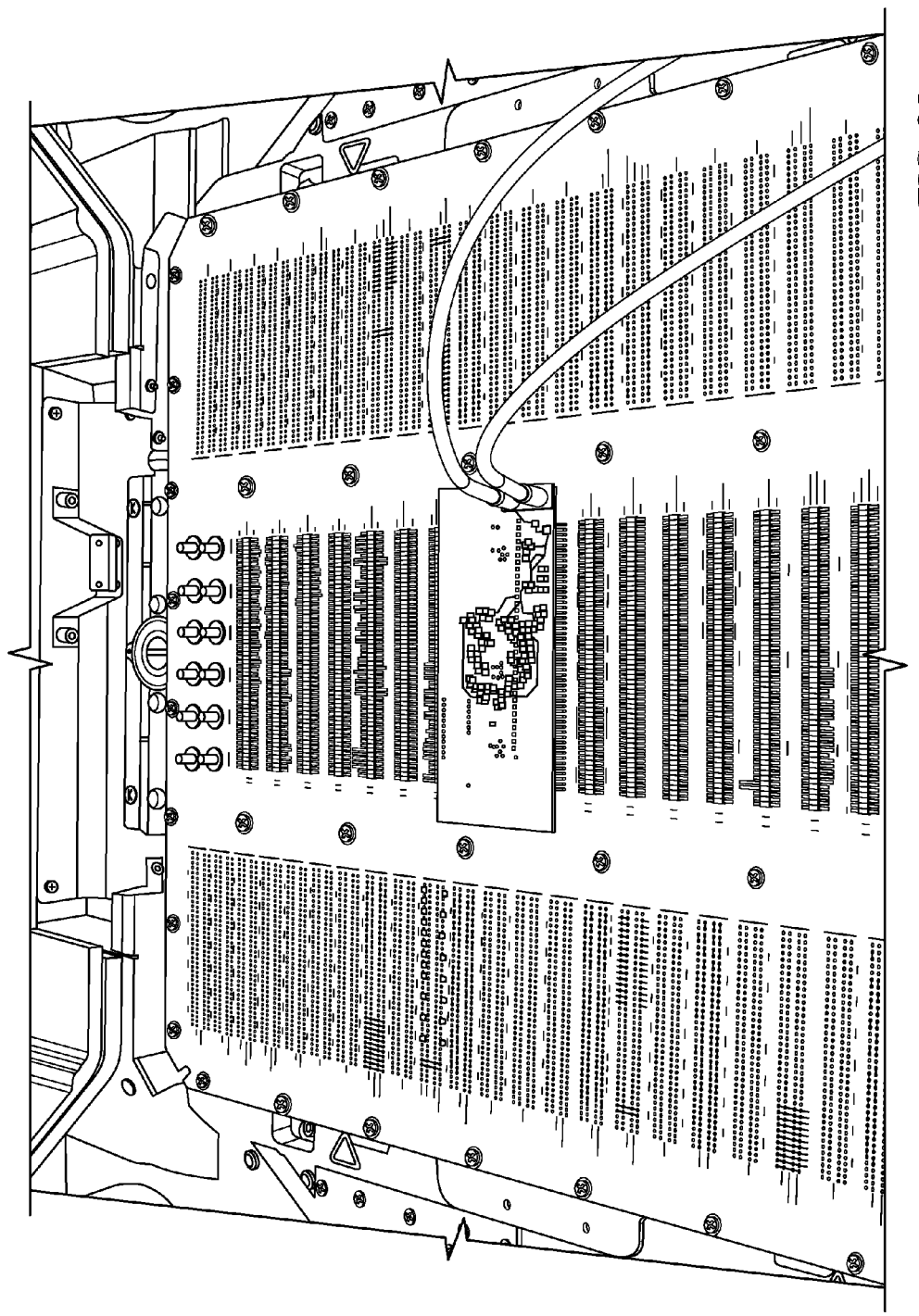
FIG. 35 is an image of a test setup for testing a high-order PLL board.
Figure 36:
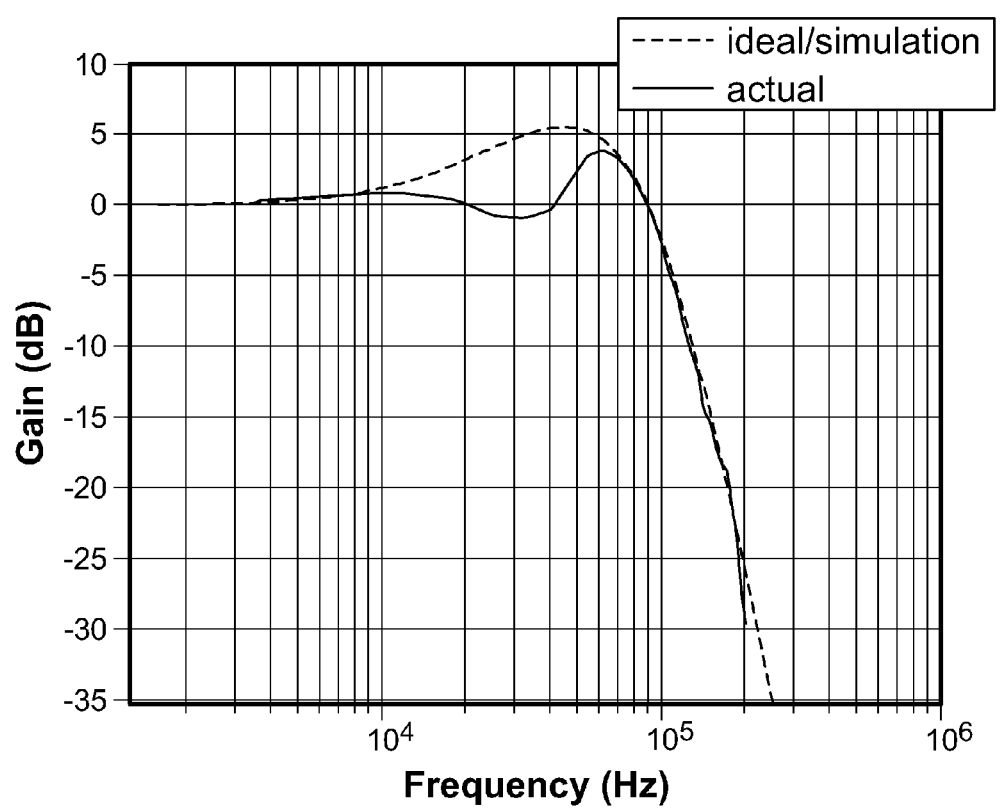
FIG. 36 is a graph of experimental and expected PLL frequency response.

A PCB board, mounted on a Teradyne Flex Tester, having the PLL specifications described hereinabove in association with the simulation (a $6^{th}$ order transfer function and a 100 kHz half power bandwidth) has been built and tested. As can be seen in FIG. 35, the added board yields a small footprint on the test head and could easily be interfaced with the device-interface-board to complement the ATE. In fact, this little board can even be added to one of the channel cards within the test head of the ATE. The opamps used to realize the active filter were built using OPA355 chips, whereas the PFD and VCO are from the TLC2932 IC chip. The high-order PLL phase transfer function is first measured and its frequency response is plotted in FIG. 36, along with the ideal frequency response. As one can see, the experimental results follow the same general trend as the ideal model. The deviation around the cutoff region is attributable to parasitic effects on the PCB board. Due to the scope time sampling resolution (about 5 bits for this setup), one can only collect reliable data down to a gain of about −30 dB.

The bit-stream was first generated in Matlab using a $5^{th}$ order sigma-delta modulator and appropriate phase or frequency mapping was performed. For the test setup, a stream of 200,000 bits was captured and stored in the cyclic source memory of the High Speed Digital (HSD) instrument of a Teradyne Flex tester. These bits were then outputted in a cyclic fashion at the desired rate through the HSD unit and then applied to the input of the PLL board. The phase or frequency filtering is then performed by the PLL and the encoded phase or frequency is recovered at the output.

For phase measurements, the bits were outputted in a cyclic fashion with a 15 ns duration through the HSD unit and then applied to the input of the PLL board. The phase filtering is then performed by the PLL and the encoded phase is recovered at the output. An additional clock signal is needed from the tester to serve as the reference signal. This signal runs at the same frequency as the PLL output but has a fixed phase.

Figure 37:
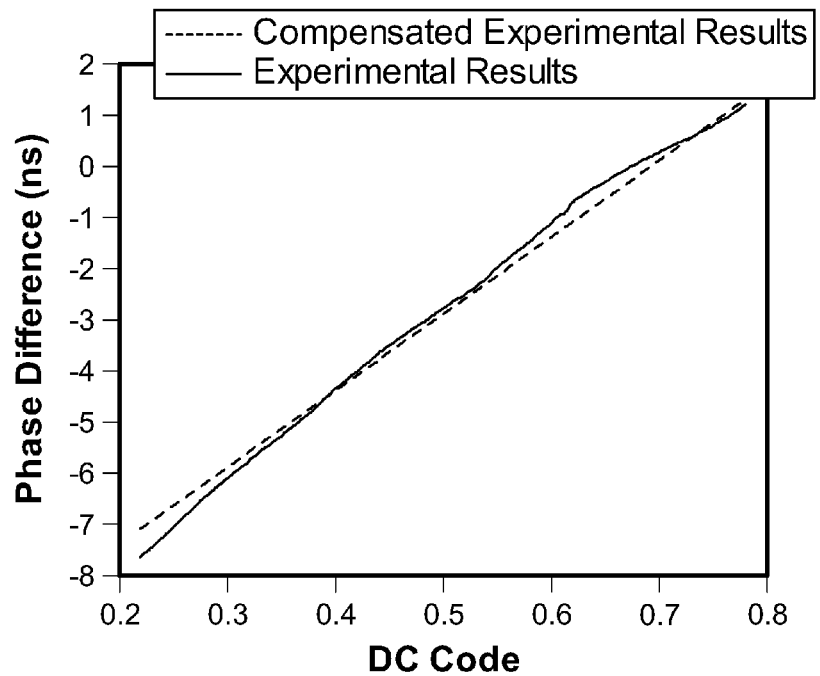
FIG. 37 is a graph of a transfer characteristic curve showing experimentally synthesized output phase versus encoded DC code.
Figure 38:
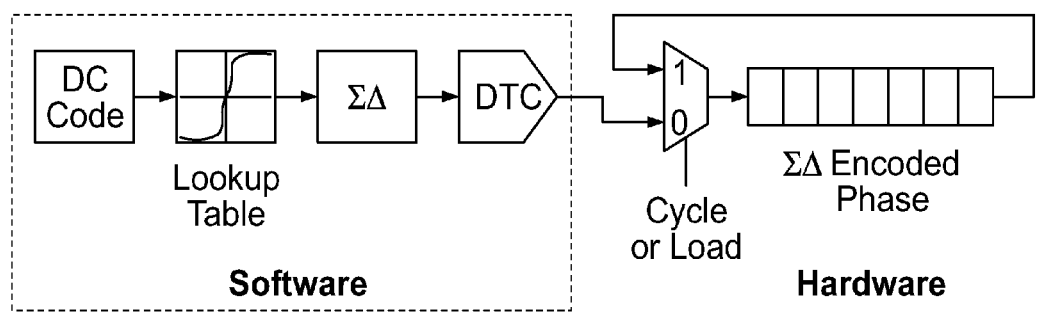
FIG. 38 depicts a phase synthesis compensation setup in which a lookup table pre-distorts the DC code in order to account for nonlinear behavior.
Figure 39:
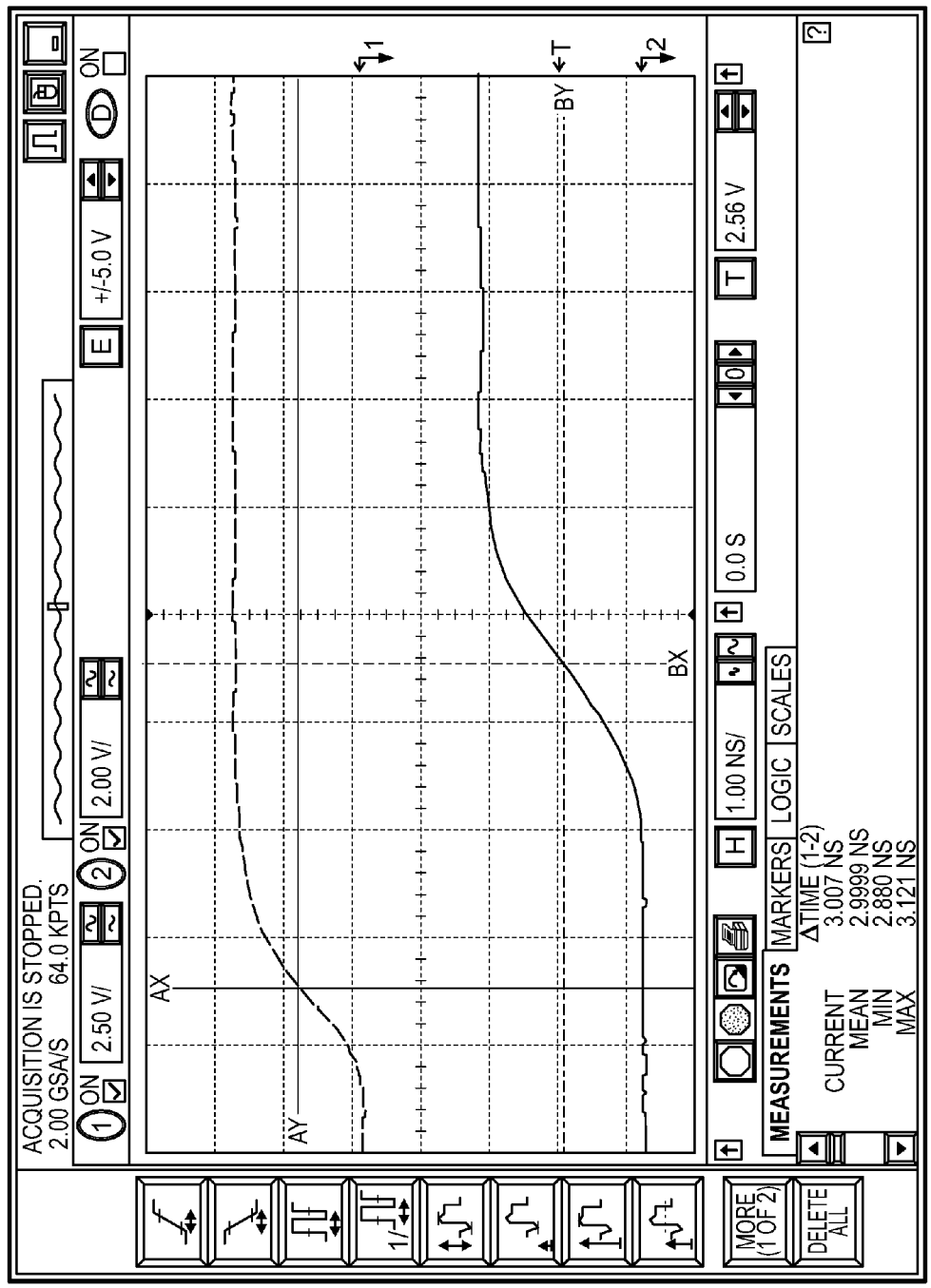
FIG. 39 is a screen capture of an oscilloscope showing a generated encoded phase of 3 ns using a sixth order PLL.
Figure 40:
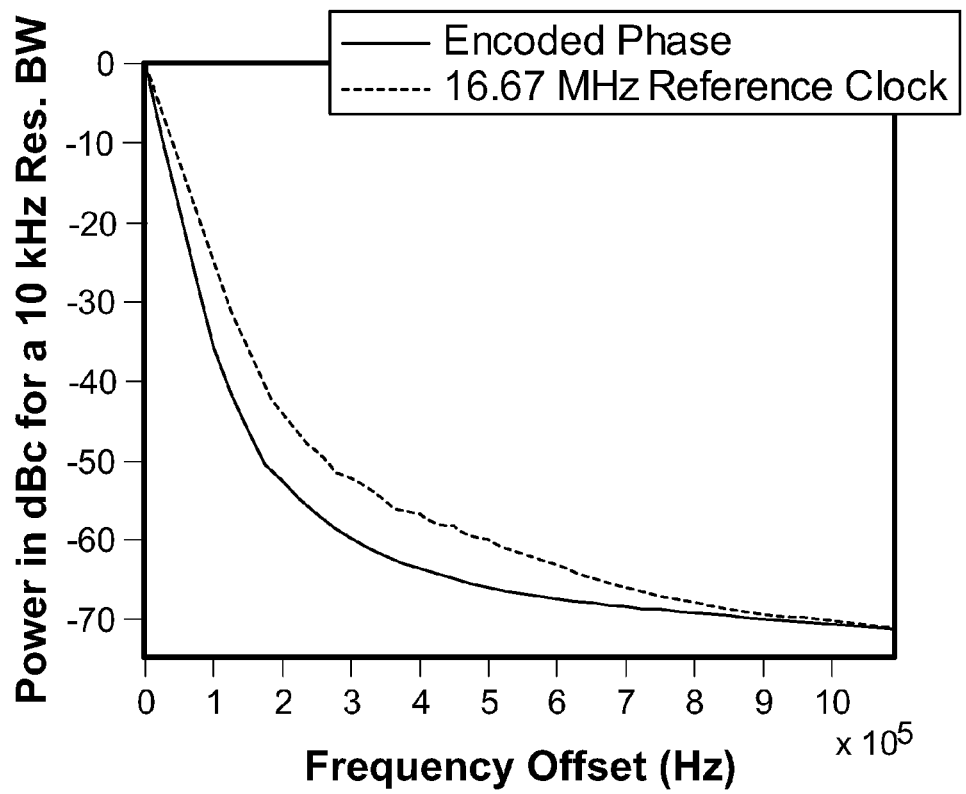
FIG. 40 is a graph of phase noise versus relative frequency offset for an encoded phase and a 16.67 MHz reference clock.

Furthermore, the sigma-delta encoded DC value has been swept and the voltage-to-time transfer characteristic curve is plotted in FIG. 37. The bits chosen cover the stable region of the sigma-delta modulator, which is about from 0.22 to 0.78, with a small DC encoded step of 0.001 giving a step size of 15 ps in the time domain. A total of 560 cases have been tested. The curve is monotonically increasing; however, the small deviations from a straight line can be related to non-linear behaviors present in the PFD, the active filter and/or the VCO. Here, the maximum absolute error compared to a best-fit line equals 380 ps. This deviation from a straight-line would correspond to a 4.4-bit linear digital-to-time conversion with an INL/DNL of less than 1 LSB. However, since the curve is a monotonic function, knowing exactly which DC code corresponds to which phase difference, proper compensation can be performed. Indeed, the DC codes can be pre-distorted by a lookup table prior to applying them to the sigma-delta modulator, as depicted in FIG. 38. As shown in FIG. 37, with this compensation setup a 9-bit conversion can be achieved with an INL/DNL of less than 1 LSB. Note that a constant phase offset that is not present in simulation is expected since the length of the path that carries the output signal differs from that of the reference signal. This offset is determined empirically and turns out to be −10.35 ns. A sample output is captured in FIG. 39 and shows an encoded 3 ns delay between the PLL output and the reference clock which corresponds to an encoded DC value of 0.49, as given by equation (20). The phase noise for the 16.67 MHz clock and an encoded phase are plotted on FIG. 40. One can observe that close to the carrier frequency, the encoded phase signal has a better phase noise performance than the reference clock up to about 1 MHz frequency offset. This can be explained by the fact that the encoded phase signal has low quantization noise for low frequencies due to the noise-shaping action of the sigma-delta modulation encoding process. For both the encoded phase signal and the reference clock, the phase noise is about −110 dBc/Hz at 1 MHz offset with respect to the carrier.

Figure 41:
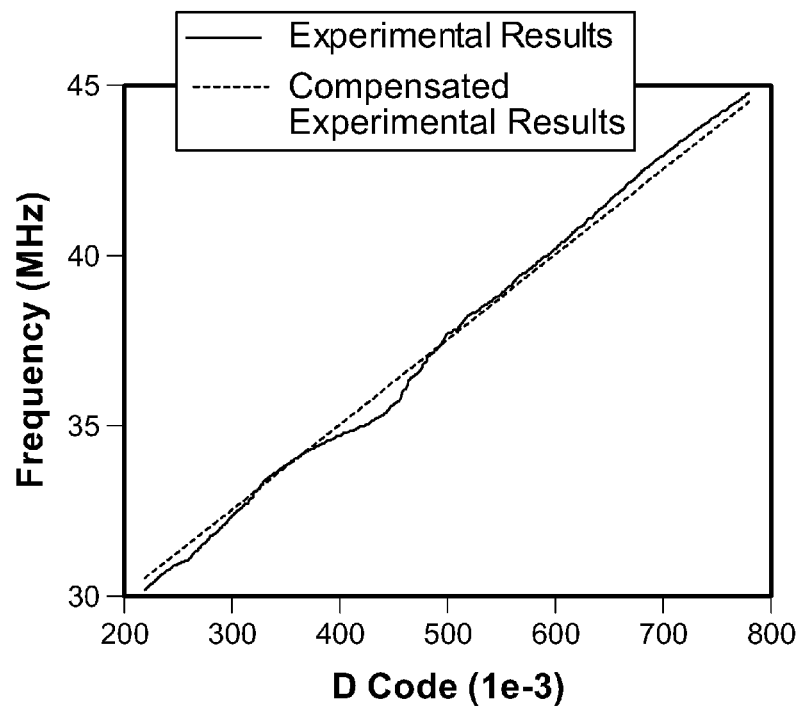
FIG. 41 is a graph of a transfer characteristic curve showing experimentally synthesized output frequency versus encoded DC code.
Figure 42:
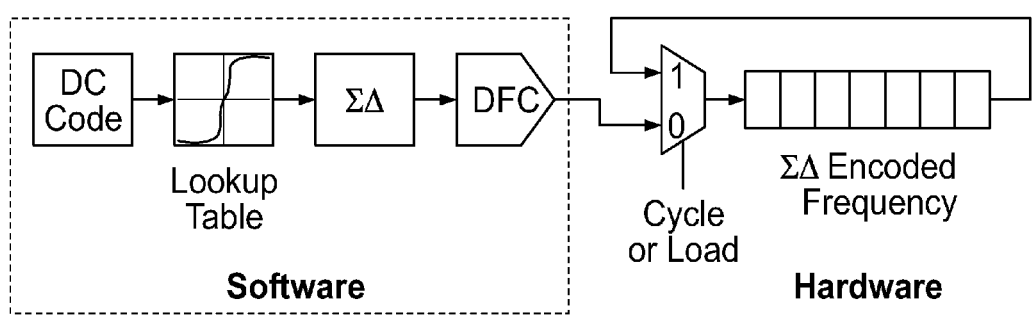
FIG. 42 depicts a frequency synthesis compensation setup in which a lookup table pre-distorts the DC code in order to account for nonlinear behavior.
Figure 43:
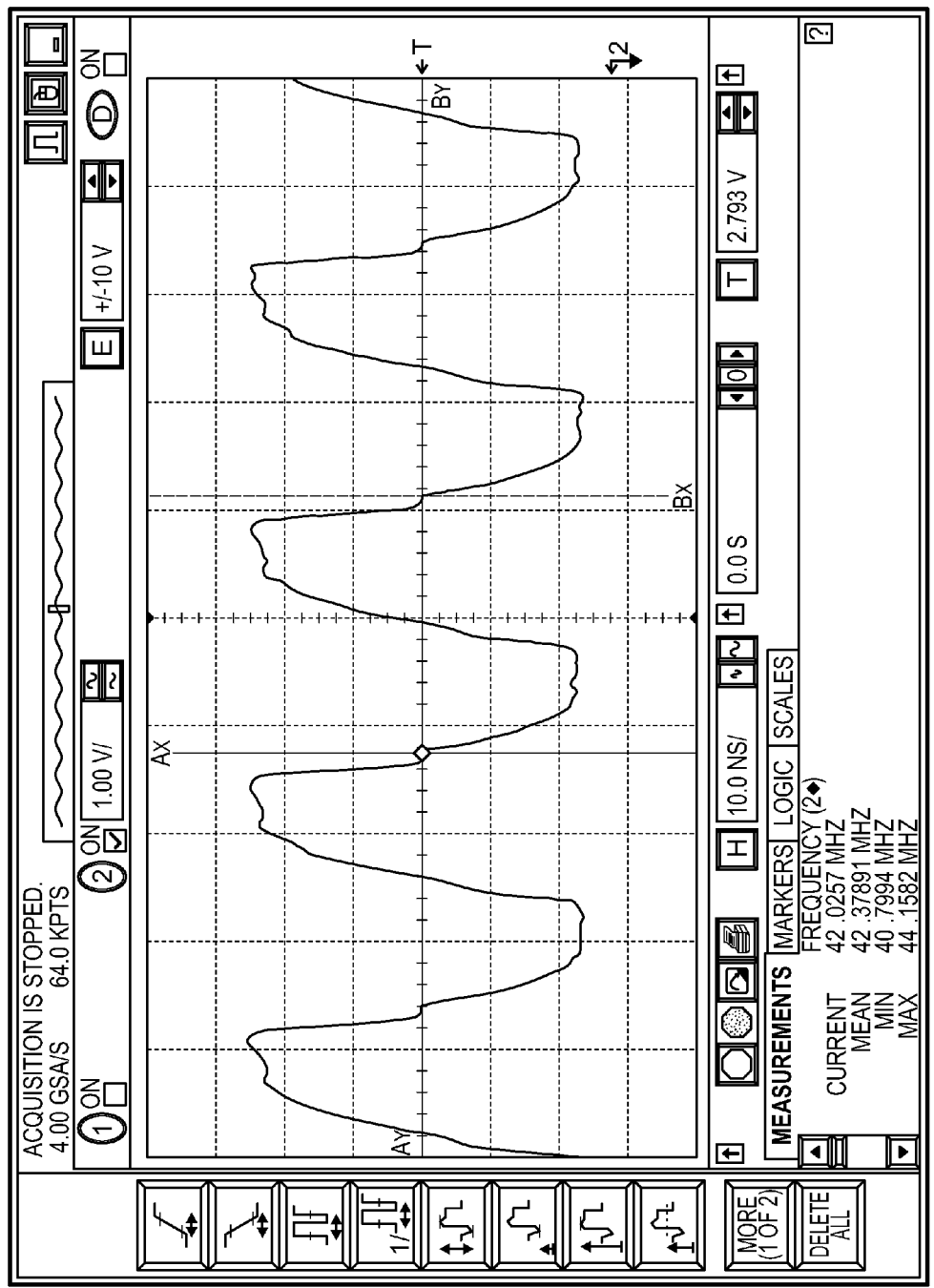
FIG. 43 is a screen capture of an oscilloscope showing a generated encoded frequency using a PLL having a sixth order transfer function.

For frequency synthesis, the bits were outputted in a similar fashion to the phase measurement at a 100 MHz rate and applied to the input of the PLL. FIG. 41 shows the transfer characteristic curve of the synthesized frequency versus the encoded DC code. It shows 560 points between DC encoded values 0.220 and 0.780 hence, giving frequencies ranging from 30.5 MHz to 44.5 MHz with a step size of 25 kHz. Note the non-linear behavior between about the DC codes 0.4 to 0.48. When compared to the ideal transfer characteristic curve, the maximum absolute error is equal to 0.66 MHz. Here again, this can be attributable to a combination of non-linear effects in the PFD, active filter and VCO. This maximum absolute error would correspond to a 4.4-bit linear digital-to-frequency conversion with an INL/DNL of less than 1 LSB. Nonetheless, once the transfer characteristic curve has been empirically determined, one knows exactly what DC-code would give the desired frequency and proper compensation would give the compensated linear curve shown in FIG. 41. In this case, a 9-bit conversion process having an INL/DNL of less than 1 LSB is achieved. FIG. 42 shows the compensation setup where a lookup table is used to pre-distort the DC code prior to applying it to the sigma-delta modulator. FIG. 43 shows a synthesized frequency example corresponding to a DC value of 0.695, as can be calculated from equation (27), this DC code would correspond to an encoded frequency of 42.375 MHz compared to the 42.379 MHz experimental value. However, the error is smaller than the 9-bit resolution LSB size (25 kHz).

Figure 44:
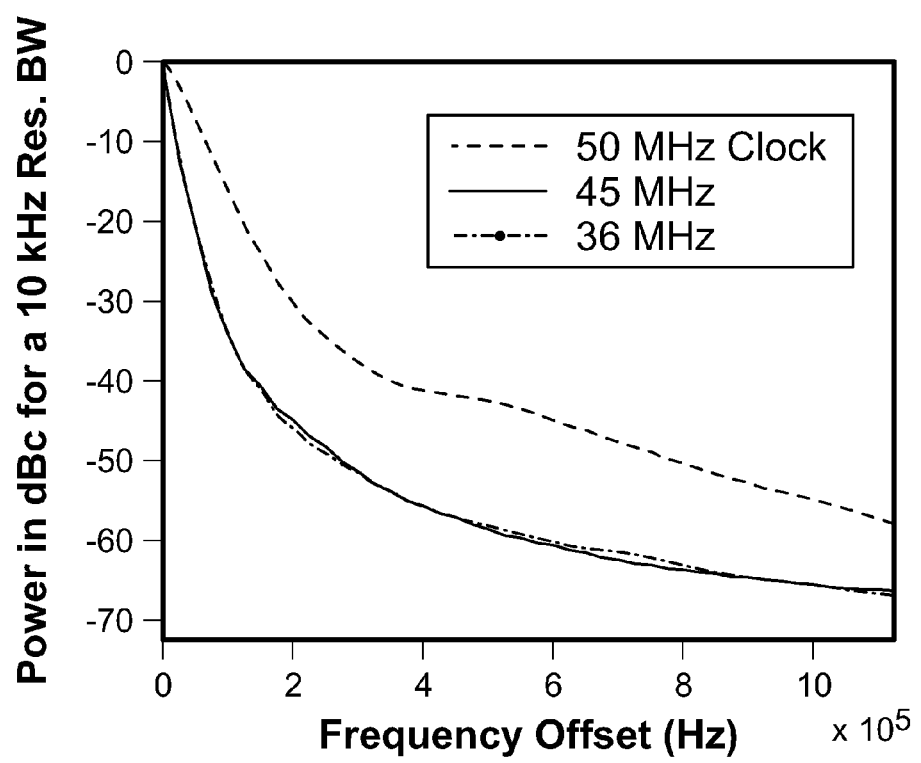
FIG. 44 is a graph of phase noise versus relative frequency offset for 50 MHz reference clock and various encoded frequencies.

FIG. 44 shows the phase noise plot of the output of the $6^{th}$ order PLL for various encoded frequencies and a 50 MHz clock input. As can be seen, the phase noise of the encoded tones is actually better than for a clock signal. This can be attributable to the noise shaping near the main tone which is not present for a clock signal. Given that the resolution bandwidth of the scope used is 10 kHz, the calculated phase noise at a 1 MHz offset for the encoded frequencies is −105 dBc/Hz compared to −94 dBc/Hz for the reference clock. Furthermore, the encoded frequency has been varied around and the phase noise plot is relatively the same regardless of the frequency.

With regards to the bit-stream length, since the Teradyne Flex tester has a large digital memory, 200 000 bits were stored and applied cyclically to the PLL board. Here, such a large bit-stream was used in order to let the performance be dictated by the experimental setup rather than the bit length. However, referring back to equation (33) above, 1024 bits are required to accurately encode a DC signal in the amplitude domain with a 9-bit resolution. Since the DFC mapping used here maps every bit in the amplitude domain to a 4-bit sequence in the frequency domain, 4096 bits in frequency would be required to generate a frequency with a 9-bit resolution. It was experimentally observed that when 4096 bits are repeated cyclically, the phase noise plot was almost identical to the case where 200 000 bits are used.

Figure 45:
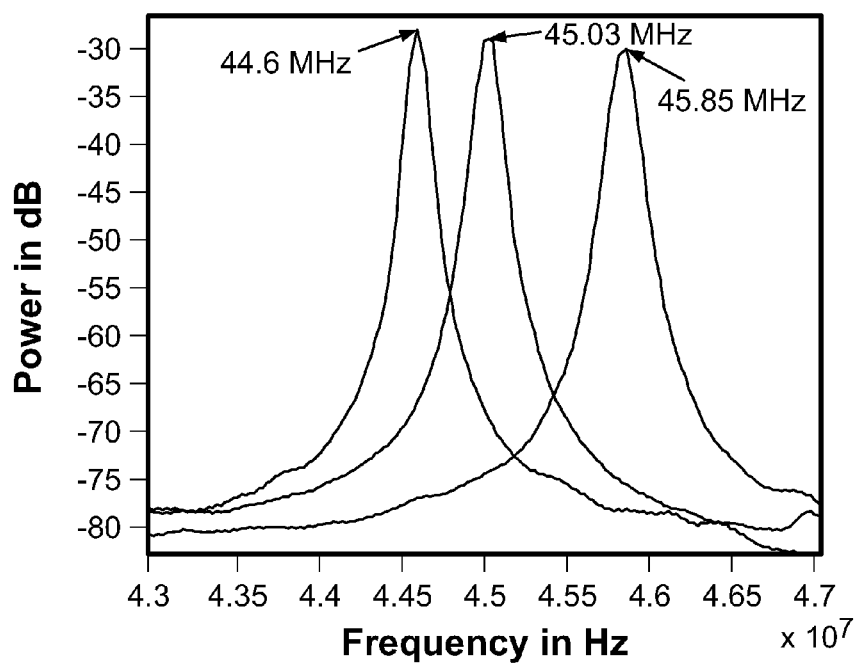
FIG. 45 is a graph depicting experimentally measured spectrum for three synthesized frequencies.

A prototype implementation consisting of an FPGA realizing the $5^{th}$ order sigma-delta modulator and DFC process that is connected to a PCB board with the described $6^{th}$ order PLL has been built and tested. Frequencies ranging from 30.5 MHz to 44.5 MHz were experimentally generated with a 25 kHz resolution. FIG. 45 shows the experimentally measured spectrum for 3 synthesized frequencies all derived from the same master clock of 100 MHz for DC input values of 0.784, 0.801 and 0.834. Given that the spectrum analyzer had a 10 kHz resolution bandwidth, the experimental phase noise is about −54 dBc/Hz at a 100 kHz offset and −87 dBc/Hz at a 1 MHz offset. Since the prototype PLL had a 100 kHz half-power bandwidth, further simulation suggests that a PLL with a smaller bandwidth would result in better phase noise performance. Nonetheless, the synthesized tones using a serial bit sequence can be used as a test stimulus for frequency sensitive devices such as high-Q filters, transceivers, PLLs, amplifiers, etc.

Herein below, the static operation of the system is discussed and the various tradeoffs impacting the time resolution are investigated. The proposed phased delay encoding scheme has been first implemented in Matlab/Simulink. A DC value is encoded using sigma-delta modulation. The resulting bit-stream is then mapped to phase using the DTC mapping algorithm to obtain a new bit-stream in the phase domain. Following that, the new bit sequence is applied to the input of a 6th order PLL model and the output phase is observed with respect to a reference clock at the PLL carrier frequency.

The sigma-delta modulator used to encode a DC value ranging from logical 0 to logical 1 has a 5th order noise transfer function, an oversampling ratio of 64 and an estimated average in-band SNR of 116 dB (using a Blackman-Harris window). To convert the bit-stream representing the DC value to a corresponding phase shift, a Matlab script that maps every "0" value to "1000" and every "1" value to "0100" is used. The "1000" corresponds to 0 degrees phase shift and "0100" to 90 degrees.

Figure 58:
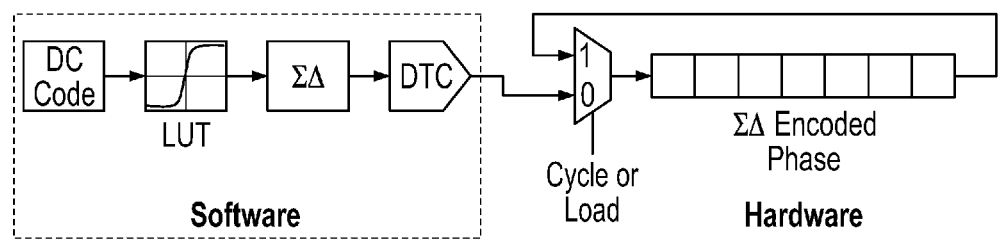
FIG. 58 is a block diagram depicting phase encoding where a lookup table pre-distorts the DC code in order to account for the non-linear behavior.

The PLL model used for simulation is defined to have the same characteristics as the one on the prototype board which was built. Hence, the PFD is defined to have a gain equal to 0.34 V/rad and the VCO has a gain equal to 76.6 Mrad/V/s, for a full output voltage swing of 5 V. At the output of the PFD is an active filter with a pole at DC, resulting in a 6th order PLL having a closed loop bandwidth of 100 kHz. In FIG. 58, one can see that the simulated transfer function of the PLL is plotted and turns out to be exactly the same as designed. This is expected, as Simulink models are ideal.

Figure 46:
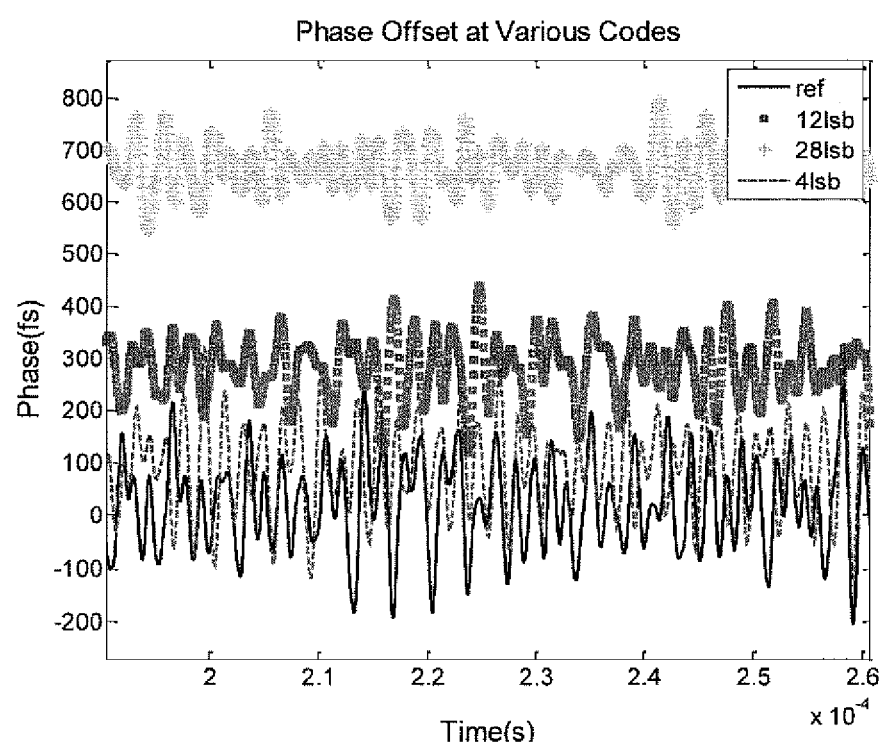
FIG. 46 is a graph of phase offsets as a function of time at 4 LSB, 12 LSB, and 28 LSB compared to a reference.

Applying the generated bits to the PLL at a rate of 66.67 MSPS results in a reference frequency that is 16.67 MHz since every code has a 4-bit duration. Using this frequency and modulator SNR, an expected time resolution is equal to 23.8 fs (time LSB). However, in order to achieve more visible phase delays, one should use about 4 times this LSB step size. FIG. 46 shows the demodulated delay for various LSB time steps away from a reference phase (corresponding to a DC code of 0.5). Although some quantization noise is visible, one can clearly observe the phase shifts corresponding to 4 LSB, 12 LSB, and 28 LSB time steps.

Figure 47:
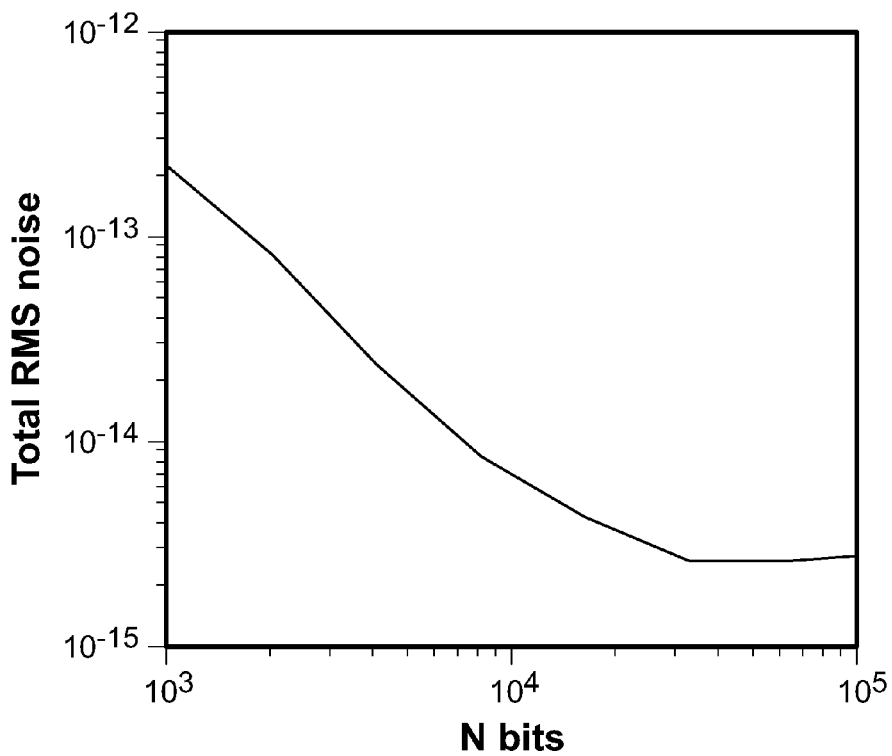
FIG. 47 is a graph of depicting simulated total RMS noise versus bit-stream length.

As described hereinabove, the smallest number of bits required to achieve a given DC resolution with a negligible AC ripple should be at least twice the number of levels (e.g. for a 10-bit DC resolution, N should be at least 2×210) as given by: $N \geq 2 \times 2^{bit\_resolution}$. In order to observe the effect of the length of the bit-stream used to encode the sigma-delta modulated on its quality, the total RMS noise within the modulator bandwidth is plotted in FIG. 47 with respect to a given length N. The above equation suggests that a bit length of 105 will suffice to achieve the desired resolution. As can be seen in FIG. 47, the noise decreases with an increase of N up to about 105, after which the noise level remains relatively constant as N is further increased.

Figure 48:
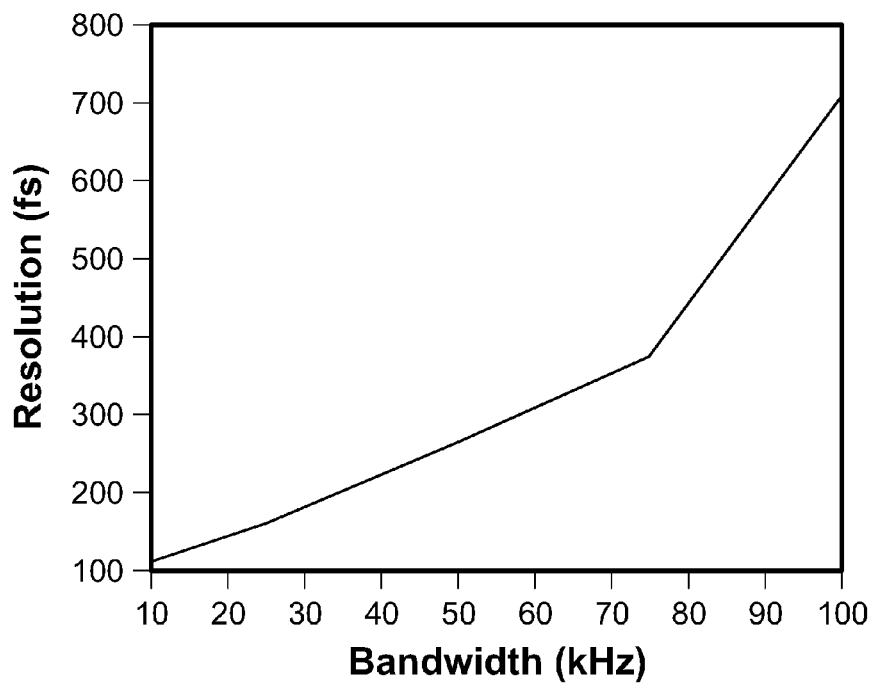
FIG. 48 is a graph depicting time resolution versus PLL bandwidth.

The manner in which various design parameters of the PLL affect the performance will now be discussed. When recovering high resolution information that is sigma-delta encoded, the order and bandwidth of the reconstruction filter, in this case, of the PLL, plays a vital role. In general, the smaller the PLL bandwidth, the more quantization noise can be filtered out and therefore the higher the performance. FIG. 48 shows the simulation result of how the time resolution varies with respect to the PLL bandwidth while all the other parameters are unchanged (i.e, sigma-delta modulator order remains at 5, OSR equals 64, 1-bit DTC with a 90 degree phase encoding range, and a PLL order of 6 designed for Gaussian low-pass response). The resolution measure used is based on an integral nonlinearity metric (INL), which corresponds to the maximum deviation of the measured result from the ideal curve. One can clearly see that the resolution gets better with tighter bandwidth.

Figure 49:
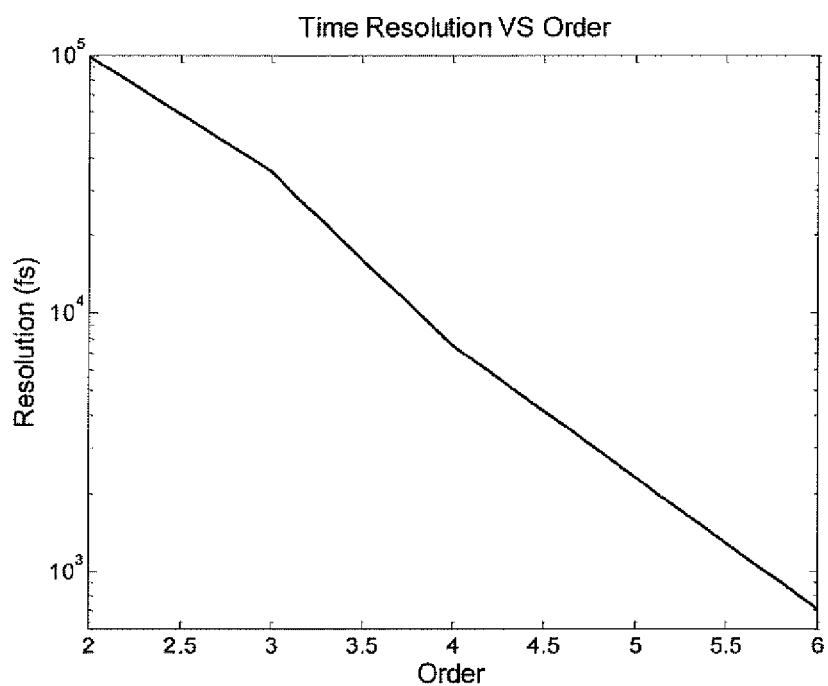
FIG. 49 is a graph plotting time resolution versus PLL order.
Figure 50:
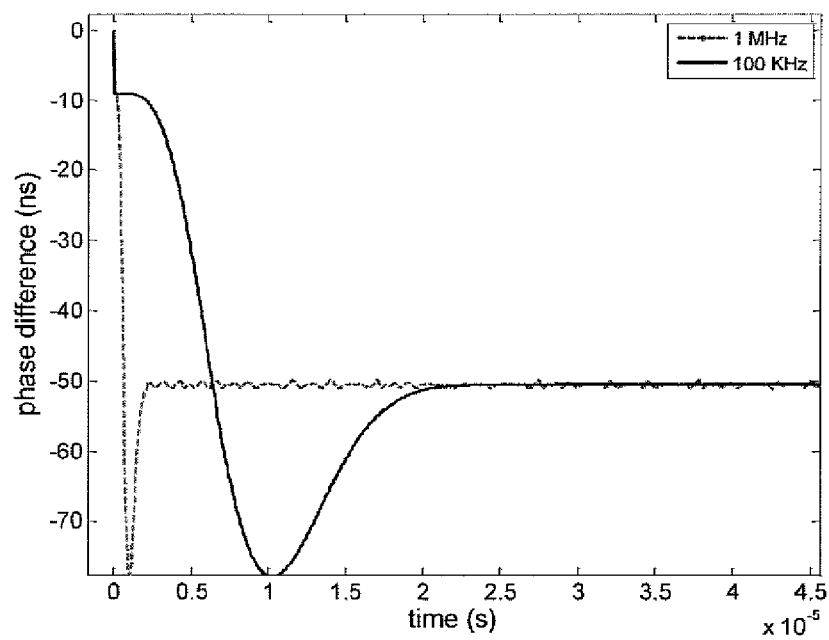
FIG. 50 is a graph depicting the transient step response for a PLL having a bandwidth of 100 kHz and 1 MHz.

Alternatively, instead of altering the filter bandwidth, one can also vary the order of the PLL, while keeping all the other parameters fixed, and observe performance change. Since the sigma-delta modulator order is unchanged, a low-order PLL cannot filter out the fast-rising high frequency quantization noise of high-order sigma-delta modulators. FIG. 49 shows the plot of resolution versus order. Not surprisingly, the higher the order, the better the resolution.

One can conclude that a high-order PLL design with a tight bandwidth is desired for the application of phase generation. This also allows the use of a high-order sigma-delta modulator with a high OSR, which can also improve the phase delay performance. Also note that for the same encoding process and bandwidth, operating with a faster clock would also result in a smaller time resolution.

The proposed scheme will now be discussed in the context of time-varying signals. The most common signal used to characterize the dynamic behavior of a system: the step response is analyzed first, and then, the steady-state response is investigated in order to analyze the system's frequency behavior and linearity by generating sinusoidal and Gaussian jitter.

Figure 51:
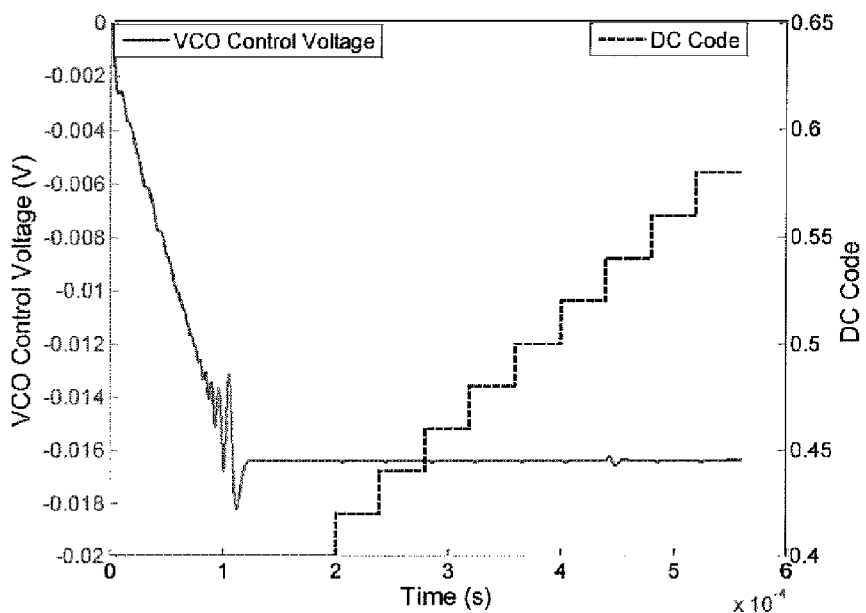
FIG. 51 is a graph plotting PLL's VCO control voltage transient response to a stair case DTC input.

FIG. 15 shows the PLL transient response to an encoded phase step for two PLL bandwidths: 100 kHz and 1 MHz. As can be observed, the higher the bandwidth, the faster the settling time; however, the more noise leaks out as well. In addition, the system has also been stimulated with a staircase input. Such simulation provides insight on how fast it can jump from one DC offset to another. FIG. 51 shows how the VCO control voltage changes to a staircase DTC input. The figure shows a large settling time for the initial first step input and then very fast transitions to the following steps. The initial settling time was measured to be 10 times the time constant (one over the PLL bandwidth) while being less than 4 times constants for the following phase delay steps.

The steady-state response of the system is investigated using a sinusoid and a Gaussian signal as input. This allows one to judge the linearity of the process in the spectral and statistical sense. The signal generation method described above is general and is not limited to a DC signal being encoded. In accordance with the above description and with the more efficient all digital method proposed here, any band-limited signal can be synthesized in the phase domain. The procedure can easily be extended to generate dynamic phase signals. For example, a sinusoid or Gaussian noise can be encoded using sigma-delta modulation and converted to the time-domain through a digital-to-time conversion process. These bits are then applied in a cyclic fashion to a PLL operating as a time-domain filter to obtain sinusoidal or Gaussian jitter. Such signals also provide insight on the frequency response and linearity of the proposed system when driven by a signal with rich frequency content.

Figure 52:
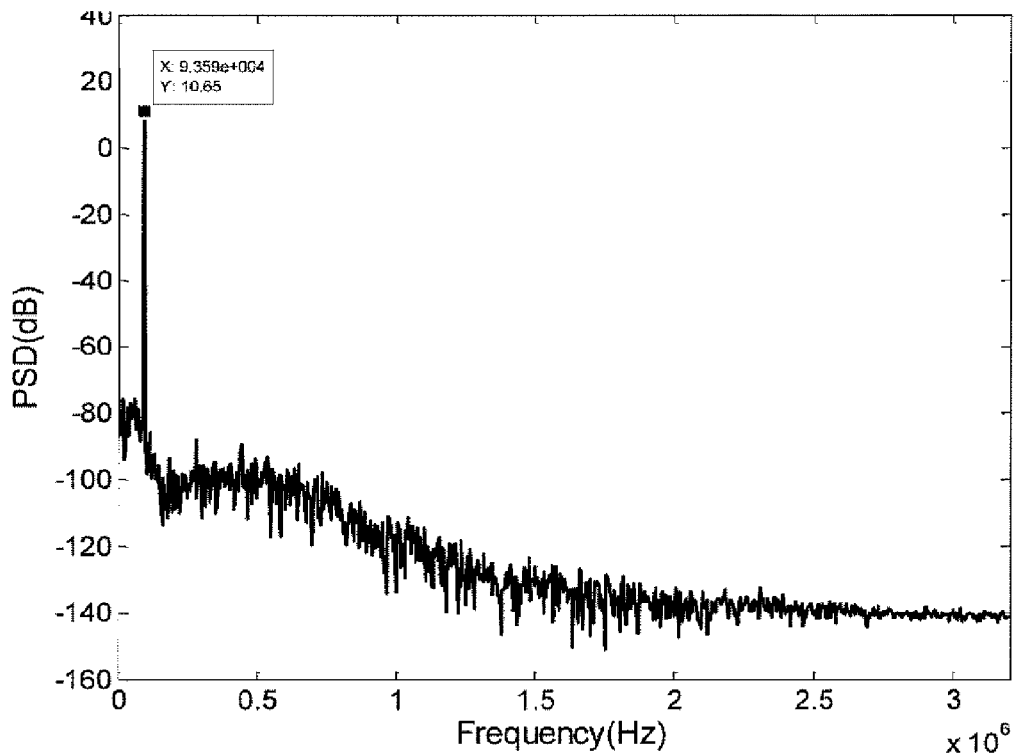
FIG. 52 is a graph depicting the spectrum of simulated sinusoidal jitter.

For example, a sinusoidal jitter having an amplitude of 0.25 has been generated in Matlab using a sigma-delta modulator having an order of 5, an in-band SNR of 116 dB, and an OSR of 64. The DTC bit mapping process for a 180 degrees phase encoding range has been used to convert the sigma-delta encoded bits from the digital amplitude domain to the time domain. The PLL used here again is 6th order and has a half-power bandwidth of 100 kHz. The generated sinusoidal has a spectrum shown in FIG. 52 and an SNR of 113 dB. Since the synthesized phase signal has a fairly close SNR to the sigma-delta modulation process used, the phase synthesis scheme does indeed preserve the SNR of the modulator.

Figure 57:
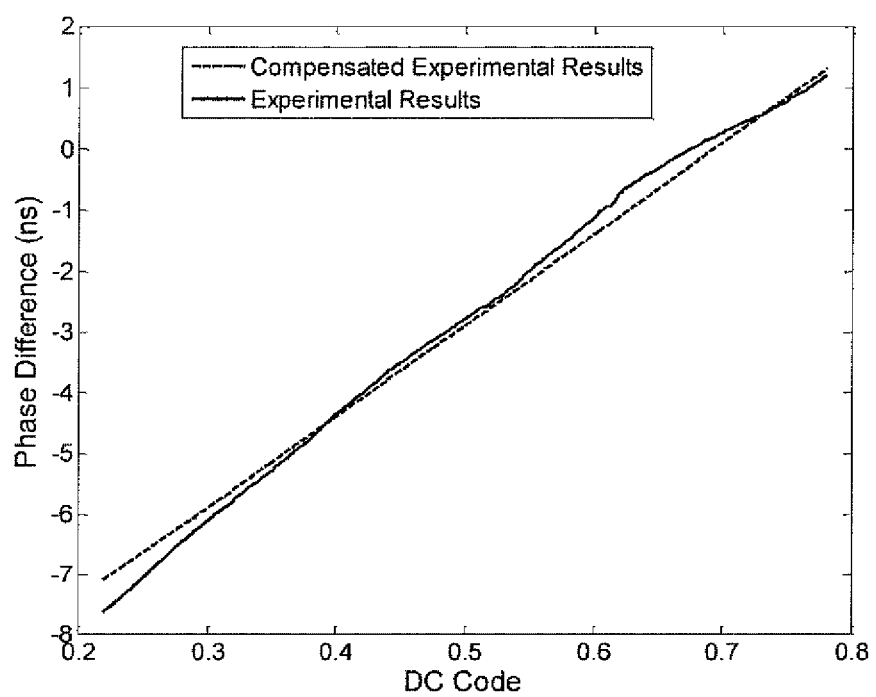
FIG. 57 is a graph depicting a transfer characteristic curve showing experimentally synthesized output phase versus encoded DC code.

The frequency response of the sinusoid has been moved away with the same amplitude and the frequency response of the system was characterized. As expected, it turned out to correspond to the PLL's transfer function response; the plot is shown in FIG. 57.

Figure 53:
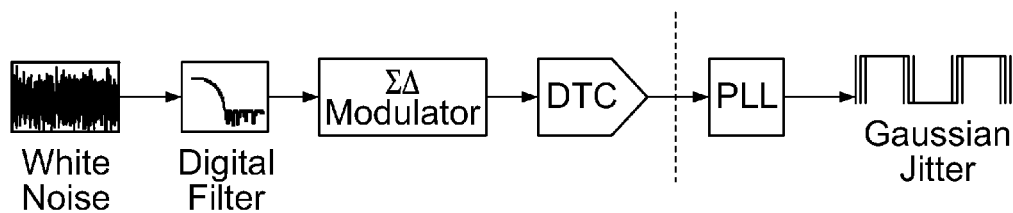
FIG. 53 is a block diagram illustrating Gaussian jitter generation, note that the components before the PLL input can be realized in software and are replaced in hardware by a cyclic memory.

It can be shown readily that a Gaussian noise signal can be generated using sigma-delta modulation. Combining that method to generate a Gaussian noise signal with the DTC algorithm described herein, a bit-stream with the desired encoded jitter can be obtained. As depicted in FIG. 53, the process to generate the sigma-delta phase encoded bits is as follows: first a white Gaussian noise source is connected to a digital low-pass filter. Then, the output of the filter (band-limited Gaussian noise) is applied to a sigma-delta modulator. The output sequence of the modulator is then inputted to a DTC and the output bitstream is collected and corresponds to the phase-domain encoded noise signal. The pulse-density modulated signal in the phase domain is then applied to a PLL in order to recover the encoded jitter. Note here that all the components prior to the PLL need not to be implemented in hardware; they can physically be replaced by a circular memory.

Figure 54:
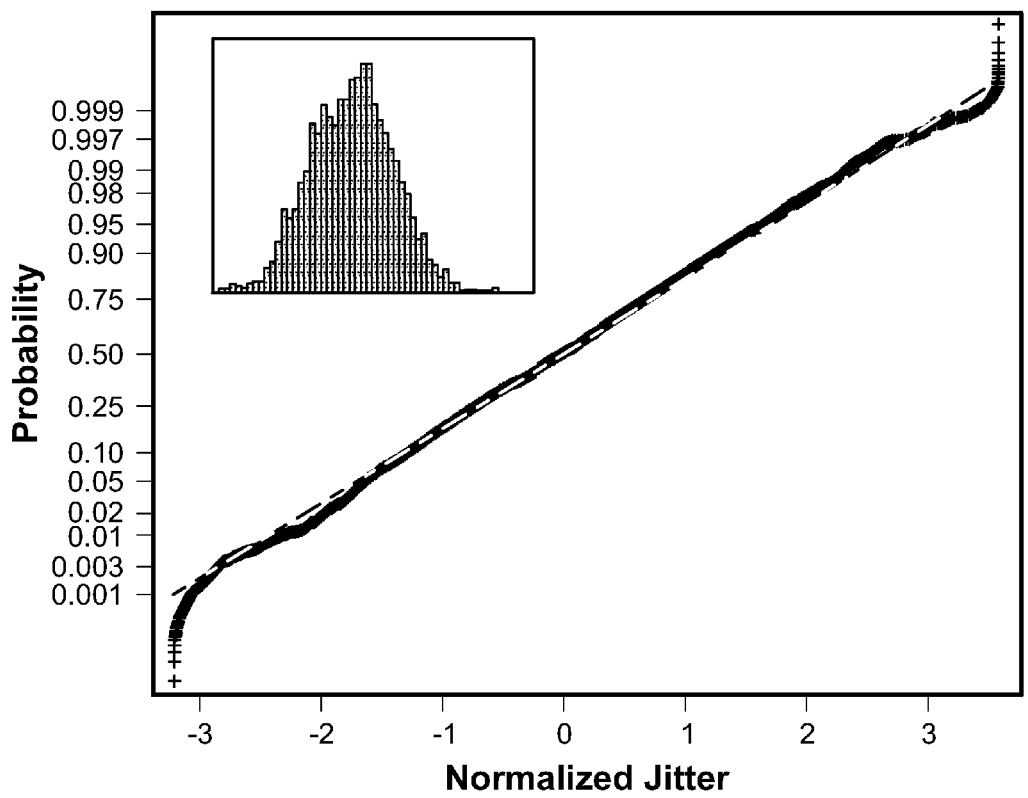
FIG. 54 depicts a normal probability plot of simulated jitter normalized to a mean of 0 and a standard deviation of 1, and an insert depicting a histogram of demodulated jitter.

In Matlab, a 2nd order modulator having an OSR of 64 has been used to encode a band-limited Gaussian noise. A 2nd order modulator has been used in order to prevent it from going unstable; however, a relatively good (more than ±3σ) Gaussian distributed noise can be achieved with this setup. A DTC with the 180 degrees encoding bit-mapping scheme is used to convert the sigma-delta encoded noise signal from the digital amplitude domain to the phase domain. Following that, a 6th order PLL having a 100 kHz bandwidth, is used as a time-domain reconstruction filter. The generated Gaussian jitter has an RMS value of 3.20 ns over an 83 kHz bandwidth with respect to the carrier. To investigate the "goodness" of the distribution, the normal probability plot is used. This plot shows the cumulative probability function versus the value of each point in the sample set. The scale of the y-axis is adjusted such that a perfect Gaussian data set would follow a straight line with the mean having a cumulative probability of 50%. FIG. 54 shows the normal probability plot of the simulated jitter where all the data is normalized to a mean of 0 and a standard deviation of 1. Also shown in the top left-hand corner of this figure is the histogram distribution of the jitter signal. As can be observed, the distribution follows Gaussian statistics up to about ±3σ away from the mean value, which corresponds to more than 99.7% of the distribution. Thus, one can conclude that the process does indeed preserve the statistical nature of the input signal.

The different aspects related with the integration of the phase signal generation scheme in an ATE environment will now be described and then the experimental results pertaining to the static and dynamic operation of the system shall be presented.

Figure 55:
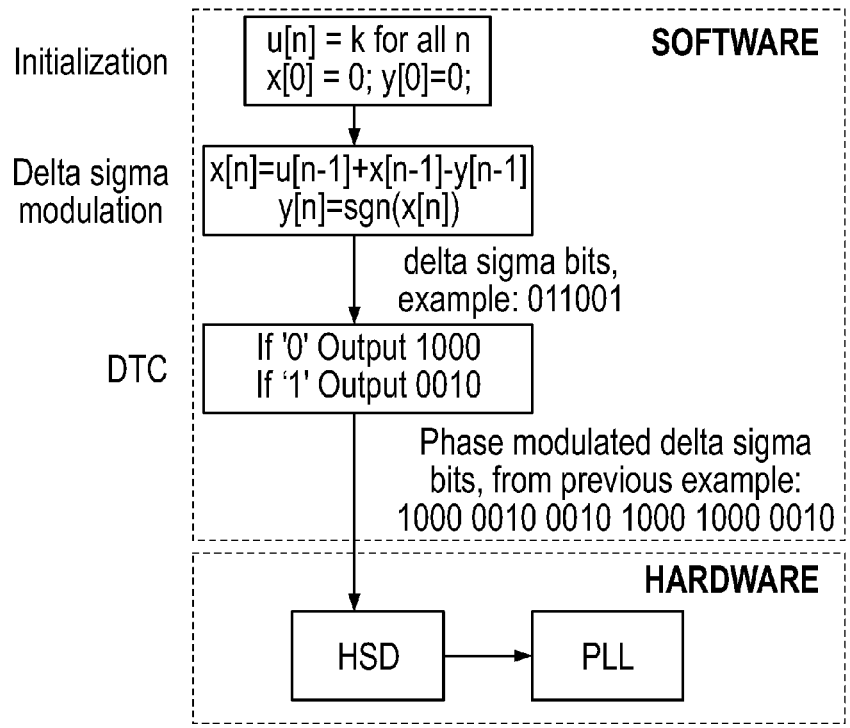
FIG. 55 is functional block diagram illustrating the steps (for a DC encoded value) of encoding the phase-domain bit-stream and loading them in the internal memory of the HSD, after which the bits are applied to the PLL to recover the phase signal.

The flow chart of the procedure used to implement the scheme on the ATE is provided in FIG. 55. Here, u[n] is the sampled version of the high resolution test signal (DC in this case). The sigma-delta modulation and the DTC mapping process occur in software and the resulting bits are loaded to the HSD unit of the ATE which are then directed to the PLL input. Note that this flow chart only shows a first order sigma-delta modulation process; in practice, any nth order modulator can be used.

Figure 56:
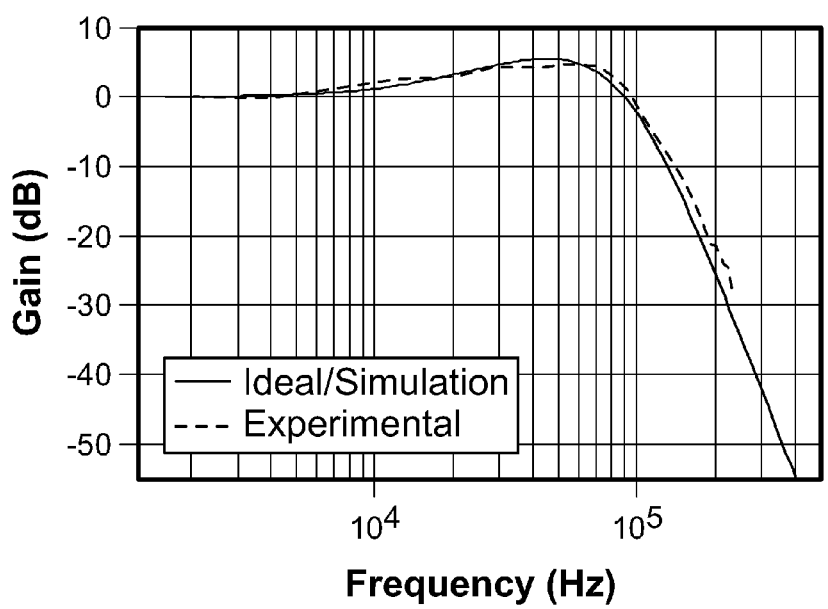
FIG. 56 is a graph depicting experimental and expected system frequency response.

A PCB board, mounted on a Teradyne Flex Tester, having the PLL specifications described earlier (i.e. a 6th order transfer function and a 100 kHz half power bandwidth) has been built and tested. As can be seen in FIG. 35, the added board yields a small footprint on the test head and could easily be interfaced with the DIB to complement the ATE. In fact, this little board can be added to one of the channel cards within the test head of the ATE. The opamps used to realize the active filter were built using OPA355 chips, whereas the PFD and VCO are from the TLC2932 IC chip. Both chips are made by Texas Instruments. The PLL phase transfer function is first measured and its frequency response is plotted in FIG. 56, along with its ideal frequency response. As one can see, the experimental results follow almost exactly the expected behavior. Due to the scope time sampling resolution (about 5 bits for this setup), one can only collect reliable data down to a gain of about −30 dB. The bits were first generated in Matlab using a 5th order sigma-delta modulator with the appropriate phase mapping. For every delay encoded, 16,384 bits corresponding to the sigma-delta phase-encoded signal were stored in the cyclic source memory of the HSD instrument of a Teradyne Flex tester and applied cyclically to the 6th order PLL board. Note that this bit length is used in all subsequent tests. The bits were outputted in a cyclic fashion at a 66.67 MSPS with a bit duration of 15 ns through the HSD unit and then applied to the input of the PLL board. Since every phase code corresponds to a 4-bit sequence, the effective frequency of the reference clock is 16.67 MHz. It is important to note the bit-mapping codes used here for both 90 degrees (used in static response) and 180 degrees (used in dynamic response) clearly exhibit a clear rising edge when jumping from one code to another, since the PFD of the PLL is edge-triggered. The phase filtering is then performed by the PLL. The encoded phase is recovered at the output and measured with respect to a reference clock.

Figure 59:
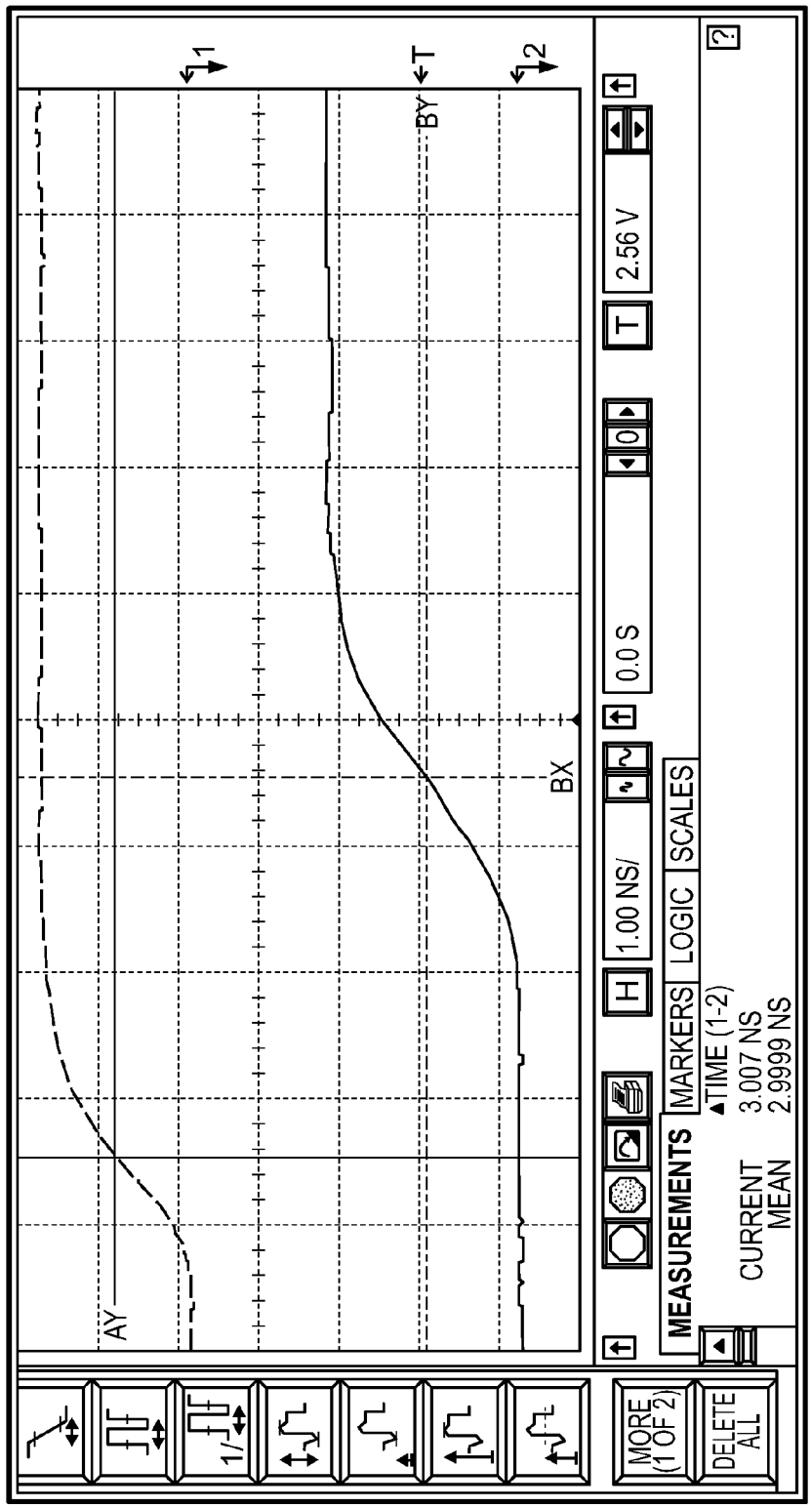
FIG. 59 is a graph depicting a programmed delay of 3 ns.

As shown in FIG. 57, the phase offset with respect to each DC code has been plotted. The DC codes used cover the stable region of the sigma-delta modulator, which is about from 0.22 to 0.78. This plot was obtained by stepping through this range in DC step sizes of 0.001 and using a 90 degrees DTC mapping process where every "0" is mapped to the sequence "1000" and every "1" to the sequence "0100". As can be observed, the curve is monotonically increasing with a linear trend as expected. However, the small deviations from a straight line behavior can be related to non-linear effects present in the PFD, the active filter and/or the VCO. Here, the maximum absolute error compared to a best-fit line equals 380 ps. This deviation from a straight-line would correspond to a 4.4-bit linear digital-to-time conversion. However, since the curve is a monotonic function, knowing exactly the correspondence between the DC code and the phase output, proper compensation can be performed. Indeed, the DC codes can be pre-distorted by a lookup table prior to applying them to the sigma-delta modulator, as depicted in FIG. 58. As shown in FIG. 57, with this compensation setup, a 9-bit conversion, or a resolution of 15 ps, was achieved with an INL of less than 1 bit. Note that a constant phase offset that is not present in simulation is expected since the length of the path that carries the output signal differs from that of the reference signal. This offset is determined empirically in this particular case and turns out to be 10.35 ns (lagging the reference clock). A sample output is captured in FIG. 59 where a programmed delay of 3 ns (corresponding to a DC code of 0.49) between the PLL output and the reference clock can be observed.

The dynamic operation of the scheme, where a sigma-delta modulator is followed by a DTC and then a PLL, is experimentally studied for time-varying inputs to assess the dynamic response of the system. First, the sinusoidal response is tested to ensure that the entire process is linear in the spectral sense, then, the response to a Gaussian noise signal is analyzed to ensure its linearity in the statistical sense using the normal probability plot.

Figure 60:
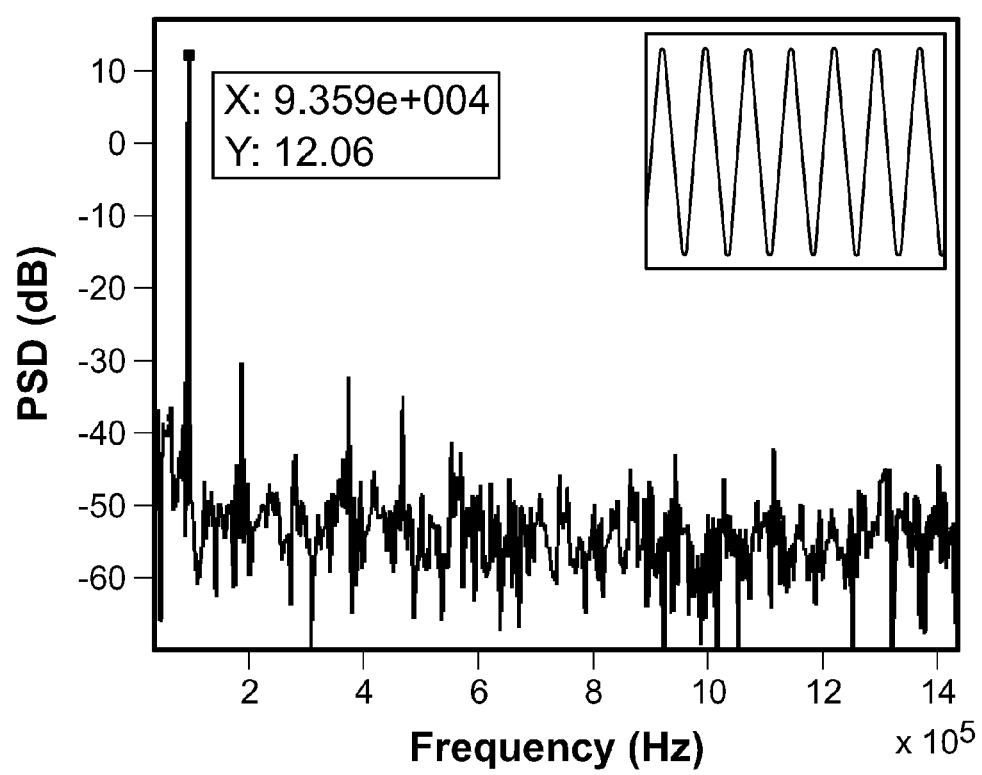
FIG. 60 is a graph of a spectrum of experimental sinusoidal jitter, and an insert depicting demodulated sinusoidal jitter.

The same setup has been used to generate a sinusoidal jitter signal. Here again, 16,384 bits, with coherence ensured, corresponding to the sigma-delta phase-encoded sinusoid were stored in the tester's HSD unit and applied repetitively to the 6th order PLL board (this bit-length was chosen in order to do a 4096 FFT since every bit in the digital-amplitude domain is mapped to a 4-bit sequence in the time/phase domain). The resulting sinewave, shown in the top-right corner of FIG. 60, has similar amplitude as the one shown in the simulation and the difference can be seen more clearly in the spectrum plot illustrated in FIG. 60, where the experimental result is about 1.41 dB higher than that obtained in the simulation. The deviation is attributable to the fact that the PLL model used in Matlab is not exactly the same as in the experimental setup and also because the chosen tone was near the pass-band edge of the PLL, which is the most sensitive region, in order to attenuate the effect of possible distortion. Indeed, a second harmonic not seen in simulation is observed due to the non-linear behaviors present in the PFD, the active filter and/or the VCO. The presence of this distortion harmonic results in a spurious-free dynamic range (SFDR) equal to 42.73 dB. Note that such measures are seldom reported for phase generated signals of this magnitude.

Figure 61:
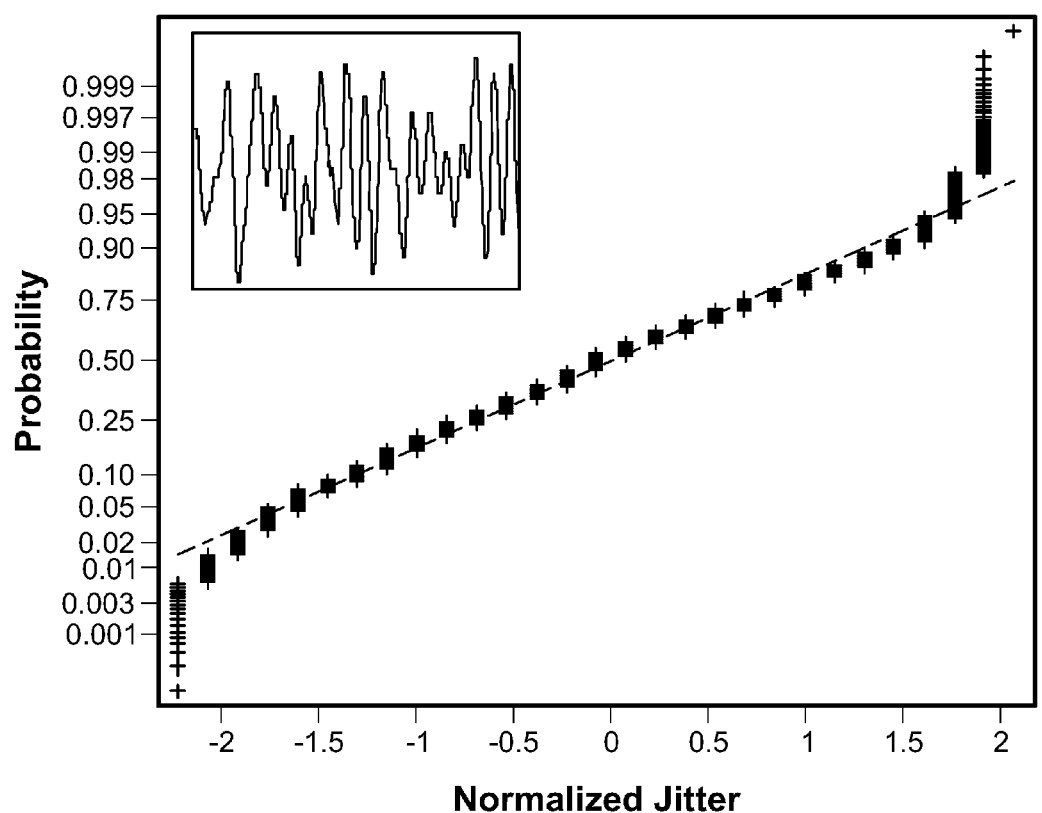
FIG. 61 is a graph of the normal probability of experimental normalized jitter to a mean of 0 and a deviation of 1, and an insert depicting the demodulated Gaussian jitter.

A Gaussian noise input provides information on the dynamic behavior in the statistical domain. A Gaussian jitter signal having a programmed standard deviation of 3.20 ns has been experimentally generated. Here again, 16,384 bits corresponding to the sigma-delta phase-encoded Gaussian signal were stored and applied cyclically to the 6th order PLL board. Using a reference clock signal running at the same frequency as the generated jittery clock, i.e. 16.67 MHz, the demodulated Gaussian jitter has been recovered and is shown inside FIG. 61 in the top left-hand corner. The experimental RMS jitter value is equal to 3.27 ns; whereas, the simulated one was 3.20 ns. The difference can be attributable to the phase digitization process itself since the scope's timing resolution is reported to be 500 ps and hence adds quantization noise to the extracted signal. The experimental normalized normal probability plot of the extracted jitter is illustrated in FIG. 61. It can be observed that the generated jitter signal follows Gaussian statistics up to about ±2σ, which corresponds to about 95.5% of the entire distribution.

Throughout the experimental validation for the prototype implementation, it was observed that the measuring equipment was the major limitation on the realized performance. Since the scope used operates with periodic signals, the experimental transient step response was not reported. Also, the Agilent scope used has a maximum sampling rate of 2 GSPS; thus, averaging had to be used to extract the synthesized phase. The quantization noise resulting from the scope time resolution probably impacted the tails of the distribution of the synthesized Gaussian jitter and increased the noise floor of the sinusoidal jitter. In addition, it is believed that a custom integrated circuit design implementing the entire PLL (PFD, VCO, and loop filter) would provide more control on the individual blocks' characteristics with regards to range, linearity and noise. Indeed, since the sigma-delta modulator was implemented in software, it was designed to have an SNR equivalent to 19 bits of resolution. However, only about 9-bit of resolution was achieved from the PCB prototype setup built from discrete components. Theoretically, a finer delay placement could be realized by simply running faster. In fact, in the experimental setup, a reference 16.67 MHz clock was used to achieve a 15 ps resolution; thus, if a 1.67 GHz clock were used instead, a 150 fs resolution would be expected for a 9-bit sigma-delta encoding process.

A low-cost phase signal generation technique embedded in an ATE framework has been presented. The three main components of the phase synthesis scheme are: a sigma-delta modulator, a DTC and a high-order PLL. The first two components are implemented in software and their digital output is exported to a Teradyne FLEX ATE high-speed digital (HSD) unit. Unlike conventional DTCs realized in hardware (e.g. multiplexer combined with delay elements), a bit-stream to bit-stream mapping algorithm is used to convert the sigma-delta encoded value to the phase domain; hence, a physical DTC is not required. The resulting bit-stream is then applied cyclically to a highorder PLL behaving as a phase-domain reconstruction filter. The overall system has been characterized under static operation (using DC phase delays) and dynamically (using a sinusoid and Gaussian noise as inputs). The impact of various design parameters (bandwidth, order, frequency, bit-stream length) on the phase generation performance was also investigated. Using a prototype setup consisting of a high-order PLL PCB mounted on the DIB board of an ATE, an adjustable phase delay having a resolution down to 15 ps within an 8.4 ns range was experimentally realized. Sinusoidal and Gaussian jitter were also experimentally generated in order to investigate the linearity of the system in the spectral and statistical sense.

The methods and circuits described hereinabove may be applied to a digital ATE environment for accurate phase and frequency generation. The versatility of the encoding scheme makes this technique adaptable to the PLL used, and embodiments in accordance with the cyclic bit-stream alternatives described above could easily be integrated in a BIST or DFT framework, and moreover, further potential applications may also include data transmission and communication systems.

Numerous other embodiments may be envisaged without departing from the scope of the instant invention.

What is claimed is:

1. A circuit comprising:
   an input port for receiving data for being encoded;
   a digital to frequency converter for encoding the data within a signal, the data encoded as signals of different frequencies within the signal to provide an encoded signal; and
   an output port for providing the encoded signal having the data encoded therein,
   wherein the plurality of different signals are at frequencies having a lowest common denominator frequency such that each period of the encoded signal is an integer multiple of periods divided by 2 of each of the different frequencies.

2. A circuit according to claim 1 comprising a multiplexer coupled for receiving a plurality of different signals, each different signal at a different frequency and for receiving the data for being encoded, the multiplexer for selecting between the different signals based on the data,
   wherein an output signal from the multiplexer forms the encoded signal.

3. A circuit according to claim 1 comprising a phase locked loop for filtering the encoded signal.

4. A circuit according to claim 1 wherein the plurality of signals are synchronized one with another.

5. A circuit according to claim 1 wherein one of the different signals comprises a DC signal for being switched into the encoded signal to represent one of the data, the DC signal resulting in a period within the encoded signal having no clock transition therein.

6. A circuit according to claim 1 comprising a sigma delta modulator for modulating the data prior to encoding thereof within the encoded signal.

7. A circuit comprising:
- an input port for receiving data for being encoded;
- a digital to frequency converter for encoding the data within a signal, the data encoded as signals of different frequencies within the signal to provide an encoded signal; and
- an output port for providing the encoded signal having the data encoded therein,
- wherein the plurality of signals are synchronized one with another, and
- wherein the plurality of signals are such that each signal comprises at least a complete half period from a rising clock edge or falling clock edge within each encoding period of time such that switching of the multiplexer results in a concatenation of the at least a half periods of the synchronized signals for resulting in a consistent phase of the encoded signal.

* * * * *